US012683561B2

(12) United States Patent
Garrett et al.

(10) Patent No.: US 12,683,561 B2
(45) Date of Patent: **\*Jul. 14, 2026**

(54) MULTI-OUTPUT SUPPLY GENERATOR WITH PARALLEL CONVERTERS

(71) Applicant: Murata Manufacturing Co., Ltd., Kyoto (JP)

(72) Inventors: James Garrett, Windham, NH (US); Sri Harsh Pakala, Chandler, AZ (US); Brendan Metzner, North Billerica, MA (US); Ivan Duzevik, Portland, ME (US); David J. Perreault, Cambridge, MA (US); John R. Hoversten, Arlington, MA (US); Yevgeniy A. Tkachenko, Belmont, MA (US)

(73) Assignee: Murata Manufacturing Co., Ltd., Kyoto (JP)

( \* ) Notice: Subject to any disclaimer, the term of this patent is extended or adjusted under 35 U.S.C. 154(b) by 462 days.

This patent is subject to a terminal disclaimer.

(21) Appl. No.: 18/353,331

(22) Filed: Jul. 17, 2023

(65) Prior Publication Data

US 2024/0080004 A1 Mar. 7, 2024

Related U.S. Application Data

(63) Continuation of application No. 17/572,024, filed on Jan. 10, 2022, now Pat. No. 12,160,208, which is a (Continued)

(51) Int. Cl.
| | |
|---|---|
| *H03F 3/21* | (2006.01) |
| *H02M 3/155* | (2006.01) |
| *H03F 1/02* | (2006.01) |

(52) U.S. Cl.
CPC ............ *H03F 3/211* (2013.01); *H02M 3/155* (2013.01); *H03F 1/0205* (2013.01); *H03F 2200/451* (2013.01)

(58) Field of Classification Search
CPC .. H03F 3/211; H03F 1/0205; H03F 2200/451; H02M 3/155

(Continued)

(56) References Cited

U.S. PATENT DOCUMENTS

| | | |
|---|---|---|
| 7,103,114 B1 | 9/2006 | Lapierre |
| 7,746,041 B2 | 6/2010 | Xu et al. |

(Continued)

FOREIGN PATENT DOCUMENTS

| | | |
|---|---|---|
| CN | 1051438 A | 5/1991 |
| CN | 1084683 A | 3/1994 |

(Continued)

OTHER PUBLICATIONS

Oota et al., "An AC-DC Converter Using a Differential Switched-Capacitor Transformer", IEEE 1998 (Year: 1998).\*

(Continued)

*Primary Examiner* — Hafizur Rahman
(74) *Attorney, Agent, or Firm* — Daly, Crowley, Mofford & Durkee, LLP

(57) ABSTRACT

Described are circuits and techniques to increase the efficiency of radio-frequency (rf) amplifiers including rf power amplifiers (PAs) through "supply modulation" (also referred to as "drain modulation" or "collector modulation"), in which supply voltages provided to rf amplifiers is adjusted dynamically ("modulated") over time depending upon the rf signal being synthesized. For the largest efficiency improvements, a supply voltage can be adjusted among discrete voltage levels or continuously on a short time scale. The supply voltages (or voltage levels) provided to an rf amplifier may also be adapted to accommodate longer-term changes in desired rf envelope such as associated with adapting transmitter output strength to minimize errors in data transfer, for rf "traffic" variations.

27 Claims, 13 Drawing Sheets

Related U.S. Application Data continuation of application No. 17/281,076, filed as application No. PCT/US2020/041162 on Jul. 8, 2020, now Pat. No. 11,245,367.

(60) Provisional application No. 62/934,651, filed on Nov. 13, 2019, provisional application No. 62/871,243, filed on Jul. 8, 2019.

(58) Field of Classification Search
USPC .......................................................... 307/52
See application file for complete search history.

(56) References Cited

U.S. PATENT DOCUMENTS

| | | | |
|---|---|---|---|
| 7,777,459 | B2 | 8/2010 | Williams |
| 7,782,027 | B2 | 8/2010 | Williams |
| 7,786,712 | B2 | 8/2010 | Williams |
| 7,812,579 | B2 | 10/2010 | Williams |
| 7,977,927 | B2 | 7/2011 | Williams |
| 8,026,763 | B2 | 9/2011 | Dawson et al. |
| 8,164,384 | B2 | 4/2012 | Dawson et al. |
| 8,212,541 | B2 | 7/2012 | Perreault et al. |
| 8,824,978 | B2 | 9/2014 | Briffa et al. |
| 8,829,993 | B2 | 9/2014 | Briffa et al. |
| 8,830,709 | B2 | 9/2014 | Perreault et al. |
| 8,830,710 | B2 | 9/2014 | Perreault et al. |
| 8,860,396 | B2 | 10/2014 | Giuliano |
| 8,957,727 | B2 | 2/2015 | Dawson et al. |
| 9,020,453 | B2 | 4/2015 | Briffa et al. |
| 9,160,287 | B2 | 10/2015 | Briffa et al. |
| 9,166,536 | B2 | 10/2015 | Briffa et al. |
| 9,172,336 | B2 | 10/2015 | Briffa et al. |
| 9,209,758 | B2 | 12/2015 | Briffa et al. |
| 9,490,752 | B2 | 11/2016 | Briffa et al. |
| 9,531,291 | B2 | 12/2016 | Perreault |
| 9,537,456 | B2 | 1/2017 | Briffa et al. |
| 9,634,577 | B2 | 4/2017 | Perreault |
| 9,755,672 | B2 | 9/2017 | Perreault et al. |
| 9,768,731 | B2 | 9/2017 | Perreault et al. |
| 9,768,732 | B2 | 9/2017 | Briffa et al. |
| 9,917,517 | B1 | 3/2018 | Jiang et al. |
| 9,979,421 | B2 | 5/2018 | Astrom et al. |
| 10,164,577 | B2 | 12/2018 | Briffa et al. |
| 10,193,441 | B2 | 1/2019 | Giuliano |
| 10,389,235 | B2 | 8/2019 | Giuliano |
| 10,658,981 | B2 | 5/2020 | Briffa et al. |
| 10,992,265 | B2 | 4/2021 | Hoversten et al. |
| 11,043,918 | B2 | 6/2021 | Tanaka et al. |
| 11,191,028 | B2 | 11/2021 | Hoversten et al. |
| 11,245,367 | B2 | 2/2022 | Garrett et al. |
| 11,558,014 | B2 | 1/2023 | Tanaka et al. |
| 11,637,531 | B1 | 4/2023 | Perreault et al. |
| 11,664,727 | B2 | 5/2023 | Giuliano et al. |
| 11,736,010 | B2 | 8/2023 | Giuliano et al. |
| 11,757,410 | B2 | 9/2023 | Hoversten et al. |
| 11,757,411 | B2 | 9/2023 | Tanaka et al. |
| 12,176,866 | B2 * | 12/2024 | Garrett ................. H02M 3/155 |
| 12,176,867 | B2 * | 12/2024 | Garrett ................. H02M 1/009 |
| 2004/0201414 | A1 | 10/2004 | Pasotti et al. |
| 2008/0019459 | A1 | 1/2008 | Chen et al. |
| 2008/0159044 | A1 | 7/2008 | Moon et al. |
| 2010/0073084 | A1 | 3/2010 | Hur et al. |
| 2012/0226929 | A1 | 9/2012 | Lee |
| 2014/0201414 | A1 | 7/2014 | Keegan et al. |
| 2015/0084701 | A1 | 3/2015 | Perreault et al. |
| 2015/0155895 | A1 * | 6/2015 | Perreault ................ H02M 3/07 |
| | | | 330/297 |
| 2016/0099686 | A1 | 4/2016 | Perreault et al. |
| 2018/0198416 | A1 | 7/2018 | Hur et al. |
| 2018/0205315 | A1 | 7/2018 | Giuliano et al. |
| 2019/0379287 | A1 | 12/2019 | Zhang et al. |
| 2020/0021196 | A1 | 1/2020 | Scoones et al. |
| 2021/0288614 | A1 | 9/2021 | Hoversten et al. |
| 2021/0385752 | A1 | 12/2021 | Hoversten et al. |
| 2022/0103066 | A1 | 3/2022 | Chen et al. |
| 2022/0131463 | A1 | 4/2022 | Giuliano et al. |
| 2022/0149725 | A1 | 5/2022 | Garrett et al. |
| 2023/0054485 | A1 | 2/2023 | Hoversten et al. |
| 2023/0056740 | A1 | 2/2023 | Perreault et al. |
| 2023/0057037 | A1 | 2/2023 | Hoversten et al. |
| 2023/0148059 | A1 | 5/2023 | Szczeszynski |

FOREIGN PATENT DOCUMENTS

| | | |
|---|---|---|
| CN | 101689662 A | 3/2010 |
| CN | 105281688 A | 1/2016 |
| CN | 113 949 258 A | 1/2022 |
| KR | 100817080 B1 | 3/2008 |
| KR | 10-2018-0019242 W | 2/2018 |
| WO | WO 2010/081843 | 7/2010 |
| WO | WO 2014/085097 | 6/2014 |

OTHER PUBLICATIONS

Das et al., Modular Isolated Vertically Symmetric Dual Inductor Hybrid Converter For Differential Power Processing, IEEE 2021. (Year: 2021).*

Radic et al., "High-Power Density Hybrid Converter Topologies for Low-Power Dc-Dc SMPS", The 2014 International Power Electronics Conference. (Year: 2014).*

Uno et al., "LLC Resonant Voltage Multiplier-Based Differential Power Processing Converter Using Voltage Divider with Reduced Voltage Stress for Series-Connected Photovoltaic Panels under Partial Shading", Electronics 2019. (Year: 2019).*

U.S. Appl. No. 18/925,683, filed Oct. 24, 2024, Hoversten et al.

U.S. Appl. No. 18/753,516, filed Jun. 25, 2024, Perreault et al.

U.S. Appl. No. 18/753,510, filed Jun. 25, 2024, Perreault et al.

U.S. Appl. No. 18/753,506, filed Jun. 25, 2024, Perreault et al.

U.S. Appl. No. 18/753,499, filed Jun. 25, 2024, Perreault et al.

U.S. Appl. No. 18/753,494, filed Jun. 25, 2024, Perreault et al.

U.S. Appl. No. 18/753,487, filed Jun. 25, 2024, Perreault et al.

Notice of Allowance dated May 20, 2024, for U.S. Appl. No. 18/353,336; 9 pages.

Intention to Grant dated Oct. 1, 2024, for Chinese Application No. 202080056421.X; 6 pages.

Korean Office Action dated Jul. 31, 2024, for Korean Application No. 10-2024-7002052; Response filed Sep. 30, 2024; 43 pages with English translation from Espacenet.

International Search Report and Written Opinion dated Oct. 2, 2024, for PCT/US2024/035361; 21 Pages.

Cheshire et al., "Flying Capacitor Four-Level Supply Modulator with Active Balancing for RF Power Amplifier Applications"; 2023 IEEE 24th Workshop on Control and Modeling for Power Electronics (COMPEL); Jun. 2023; 7 pages.

Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.

Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.

Chen, et al.; "A High Efficiency High Power Step-Up Resonant Switched-Capacitor"; 2012 IEEE Energy Conversion Congress and Exposition (ECCE); Sep. 15-20, 2012; 5 Pages.

Shoyama, et al.; "Resonant Switched Capacitor Converter with High Efficiency"; 2004 35th Annual IEEE Power Electronics Specialists Conference; 2004; 7 Pages.

Sun, et al.; "High Power Density, High Efficiency System Two-Stage Power Architecture for Laptop Computers"; 2006 37th IEEE Power Electronics Specialists Conference; Jun. 18-22, 2006; 7 Pages.

Unknown; "Fundamentals of Power Electronics"; Chapter 19: Resonant Conversion; Sep. 19, 2019; 87 Pages.

Yeung, et al.; "Multiple and Fractional Voltage Conversion Ratios for Switched-capacitor Resonant Converters"; 2001 IEEE 32nd Annual Power Electronics Specialists Conference (IEEE Cat. No.01CH37230); Jun. 17-21, 2001; 6 Pages.

(56) References Cited

OTHER PUBLICATIONS

International Search Report and Written Opinion of the ISA dated Nov. 13, 2020 for PCT/US2020/041162; 13 Pages.

U.S. Non-Final Office Action dated Aug. 9, 2021 for U.S. Appl. No. 17/281,076; 12 Pages.

Response to U.S. Non-Final Office Action dated Aug. 9, 2021 for U.S. Appl. No. 17/281,076; Response filed Aug. 25, 2021; 9 Pages.

Notice of Allowance dated Sep. 27, 2021 for U.S. Appl. No. 17/281,076; 9 Pages.

PCT International Preliminary Report of Patentability dated Jan. 20, 2022 for International Application No. PCT/US2020/041162; 9 Pages.

Extended European Search Report dated Jun. 15, 2023 for European Patent Application No. 20837180.7; 9 Pages.

Chen Minjie et al., "Multitrack Power Conversion Architecture", IEEE Transactions on Power Electronics, Institute of Electrical and Electronics Engineers, vol. 32, No. 1, Jan. 2017; pp. 325-340 (16 pages).

Korean Office Action dated Jul. 3, 2023, for Korean Patent Application No. 10-2022-7004103; 7 Pages.

Non-Final Office Action dated Mar. 21, 2024, for U.S. Appl. No. 17/572,024; 14 pages.

Texas Instruments Application Report SLVA750A; May 2016; 15 pages.

Non-Final Office Action dated May 20, 2024, for U.S. Appl. No. 18/353,336; 12 pages.

Non-Final Office Action dated May 23, 2024, for U.S. Appl. No. 18/353,337; 12 pages.

Response to U.S. Non-Final Office Action dated May 20, 2024, for U.S. Appl. No. 18/353,336; Response filed Sep. 11, 2024; 9 Pages.

Response to U.S. Non-Final Office Action dated May 23, 2024, for U.S. Appl. No. 18/353,337; Response filed Sep. 5, 2024; 11 Pages.

Korean Office Action (w/English translation) dated Jul. 31, 2024 for Korean Patent Application No. 10-2024-7002052; 18 pages.

Chinese Office Action (w/English translation) dated Aug. 1, 2024 for Chinese Patent Application No. 202080056421.X; 9 pages.

Response to U.S. Non-Final Office Action dated Mar. 21, 2024, for U.S. Appl. No. 17/572,024; Response filed Jul. 22, 2024; 10 pages.

Notice of Allowance dated Aug. 19, 2024, for U.S. Appl. No. 17/572,024; 11 pages.

U.S. Appl. No. 18/353,336,filed Jul. 17, 2023, James Garrett, et al.

U.S. Appl. No. 18/353,337, filed Jul. 17, 2023, James Garrett, et al.

Korean Office Action dated Jul. 3, 2023, for Korean Patent Application No. 10-2022-7004103 (with English translation); 7 pages.

Chen Minjie et al., "Multitrack Power Conversion Architecture", IEEE Transactions on Power Electronics, vol. 32, No. 1, Jan. 2017; pp. 325-340 (16 pages).

Chinese Office Action dated Nov. 29, 2023, for Chinese Patent Application No. 202080056421.X; 13 pages (w/English translation).

Notice of Allowance dated Sep. 18, 2024, for U.S. Appl. No. 18/353,337; 11 pages.

English translation of Notice of Allowance dated Apr. 27, 2025, for Korean Patent Application No. 10- 2024-7002052; 1 page.

Korean Notice of Allowance dated Oct. 17, 2023, for Korean Patent Application No. 10-2022-7004103; 8 pages.

Chinese Office Action dated Nov. 29, 2023, for Chinese Application No. 202080056421.X; 13 pages.

Response to Extended European Search Report dated Jun. 15, 2023, for European Patent Application No. 20837180.7; Response filed Jan. 8, 2024; 14 pages.

* cited by examiner

100

100    102    104

MULTI-OUTPUT SUPPLY GENERATOR WITH PARALLEL CONVERTERS

CROSS REFERENCE TO RELATED APPLICATIONS

This application is a continuation of pending U.S. application Ser. No. 17/572,024 filed Jan. 10, 2022, which is a continuation of U.S. application Ser. No. 17/281,076 filed Mar. 29, 2021, which issued on Feb. 8, 2022 as U.S. Pat. No. 11,245,367, which is a U.S. National Stage Application of International Application PCT/US2020/041162 filed in the English language on Jul. 8, 2020, which claims the benefit of U.S. Provisional Application 62/871,243 filed on Jul. 8, 2019, and U.S. Provisional Application No. 62/934,651 filed on Nov. 13, 2019. The entire contents of these applications are incorporated by reference herein.

BACKGROUND

As is known in the art, the efficiency of radio-frequency (rf) power amplifiers (PAs) can be improved through a technique referred to as "supply modulation" (also sometimes referred to as "drain modulation" or "collector modulation"). In such a technique, a power supply voltage provided to the PA is adjusted dynamically ("modulated") over time depending upon the RF signal being synthesized. For the largest efficiency improvements, supply voltage can be adjusted discretely (among discrete levels) or continuously on a short time scale that tracks or dynamically accommodates rapid variations in rf signal amplitude (or envelope), such as may occur as data is encoded in the rf signal or as the rf signal amplitude is desired to be changed with high envelope bandwidth (e.g., as in envelope tracking, envelope tracking advanced, polar modulation, "class G" power amplification, multilevel backoff, multilevel LINC, Asymmetric Multilevel Outphasing, etc.). The power supply voltage (or voltage levels) provided to the PA may also be adapted to accommodate longer-term changes in desired rf envelope (e.g., "adaptive bias") such as associated with adapting transmitter output strength to minimize errors in data transfer, for rf "traffic" variations, etc.

"Continuous" supply modulation (e.g., "envelope tracking" or "adaptive bias") may be advantageously realized by dynamically selecting an intermediate voltage from among a set of discrete power supply voltages and then further regulating (stepping down) this intermediate voltage to create a continuously-variable supply voltage to be provided to the power amplifier. Some rf amplifier systems utilize "Discrete" supply modulation (or discrete "drain modulation") in which the supply voltage is switched among a set of discrete voltage levels, possibly including additional filtering or modulation to shape the voltage transitions among levels. Systems of this type are described, for example, in, and include "class G" amplifiers, multi-level LINC (MLINC) Power Amplifiers, Asymmetric Multilevel Outphasing (AMO) Power Amplifiers, Multilevel Backoff amplifiers (including "Asymmetric Multilevel Backoff" amplifiers) and digitized polar transmitters among other types. Hybrid systems which utilize a combination of continuous and discrete supply modulation may also be realized.

SUMMARY

Described are concepts, systems, circuits and techniques to improve the efficiency of radio-frequency (rf) amplifiers including rf power amplifiers (PAs) through "supply modulation" (also referred to as "drain modulation" or "collector modulation"), in which a power supply voltage provided to the rf amplifiers is adjusted dynamically ("modulated") over time depending upon characteristics (e.g. amplitude levels) of the rf signal being synthesized. For the largest efficiency improvements, supply voltage can be adjusted discretely (among discrete levels) or continuously on a short time scale that tracks or dynamically accommodates rapid variations in rf signal amplitude (or envelope), such as may occur as data is encoded in the rf signal or as the rf signal amplitude is desired to be changed with high envelope bandwidth (e.g., as in envelope tracking, envelope tracking advanced, polar modulation, "class G" power amplification, multilevel backoff, multilevel LINC, Asymmetric Multilevel Outphasing, etc.). The power supply voltage (or voltage levels) provided to the PA may also be adapted to accommodate longer-term changes in desired rf envelope (e.g., "adaptive bias") such as associated with adapting transmitter output strength to minimize errors in data transfer, for rf "traffic" variations, etc.

In accordance with one aspect of the concepts, systems, devices and techniques described herein, in a system having m power supply voltages ($V_1$-$V_m$), a method to generate a set of supply voltages comprising: (a) independently controlling two (2) of the m power supply voltages (Vx and Vy where x, y are both in the range of 1-m); and (b) distributing the other m−2 power supply voltages in a prescribed relation to the two independently-controlled power supply voltages such that independent control of the two (2) of the m power supply voltages is equivalent to independently specifying or controlling one or more of: (1) a minimum supply voltage level ($V_{min}$) and a maximum supply voltage level ($V_{max}$) with the spacing between the minimum and maximum voltage levels ΔV determined in terms of the minimum supply voltage level ($V_{min}$) and the maximum supply voltage level ($V_{max}$) and a total number of levels m; (2) a minimum supply voltage level ($V_{min}$) and an inter-level voltage spacing ΔV with a maximum supply voltage level ($V_{max}$) determined by an inter-level voltage spacing ΔV and a total number of levels m; and (3) a maximum supply voltage level ($V_{max}$) and an inter-level voltage spacing ΔV with a minimum supply voltage level ($V_{min}$) determined by an inter-level voltage spacing ΔV and a total number of levels m. In embodiments, distributing the other m−2 power supply voltages in a prescribed relation comprises using a differential switched-capacitor circuit to automatically distribute the other m−2 power supply voltages. In embodiments, distributing the other m−2 power supply voltages in a prescribed relation comprises using a differential switched-capacitor circuit to provide charge transfer so as to automatically distribute the other m−2 power supply voltages. In embodiments, distributing the other m−2 power supply voltages in a prescribed relation comprises synthesizing the other m−2 power supply voltages from the two independently created power supply voltages. In embodiments, synthesizing supply voltages from two independently created power supply voltages comprises synthesizing supply voltages from two independently created power supply voltages via a differential switched-capacitor circuit to provide charge transfer. In embodiments, distributing the other m−2 power supply voltages in a prescribed relation to the two independently-controlled power supply voltages comprises distributing the other m−2 power supply voltages such that the other m−2 power supply voltages are spaced in an even fashion between and/or around the two independently controlled power supply voltages. In embodiments, distributing the other m−2 power supply voltages are spaced in an even fashion between or around the two independently controlled power supply voltages comprises distributing the other m−2 power supply voltages such that adjacent voltage levels each separated by a voltage $\Delta V$. In embodiments, the method comprises independently regulating two voltages $V_1$ and $V_m$ and spacing the other m−2 voltages equally between them to provide m power supply voltages $V_k = V_1 + (k-1) \cdot (V_m - V_1)/(m-1)$ for k=1 . . . m. In embodiments, m=3. In embodiments, m=4.

In accordance with a further aspect of the concepts, systems, devices and techniques described herein, a system to generate a set of power supply voltages comprises means for providing m power supply voltages $(V_1 - V_m)$ with two (2) of the m power supply voltages (e.g., $V_1$ and $V_m$) capable of being independently controlled; means for independently controlling the two (2) of the m power supply voltages (e.g., $V_1$ and $V_m$) capable of being independently controlled; and means for distributing the other m minus two (m−2) power supply voltages in a prescribed relation to the two power supply voltages capable of being independently controlled.

In embodiments, at least two of the m power supply voltages (e.g., $V_1$ and $V_m$) are capable of being independently controlled. In embodiments, the means for independently controlling is configured to control at least two of the at least two of m power supply voltages. In embodiments, the other m−2 power supply voltages are distributed in relation to the two independently-controlled power supply voltages such that the other m−2 power supply voltages are spaced in an even fashion between and/or around the two independently-controlled power supply voltages. In embodiments, the other m−2 power supply voltages are evenly spaced between and/or around the two independently-controlled power supply voltages with adjacent voltage levels each separated by a voltage $\Delta V$. In embodiments, the means for independently controlling the two (2) of the m power supply voltages (e.g., $V_1$ and $V_m$) are provided as means for independently regulating first and second voltages $V_1$ and $V_m$ and the means for distributing the other m−2 power supply voltages comprises means for spacing the other m−2 voltages equally between first and second voltages $V_1$ and $V_m$ such that the system provides m power supply voltages $V_k = V_1 + (k-1) - (V_m - V_1)/(m-1)$ for k=1 . . . m. In embodiments, the means for independently controlling the two (2) of the m power supply voltages (e.g., $V_1$ and $V_m$) and the means for distributing the other m−2 power supply voltages in a prescribed relation to the two independently-controlled power supply voltages operate such that the means for independently controlling and means for distributing are equivalent to independently specifying or controlling one or more of: (1) a minimum supply voltage level $(V_{min})$ and a maximum supply voltage level $(V_{max})$ with the spacing between the minimum and maximum voltage levels $\Delta V$ determined in terms of the minimum supply voltage level $(V_{min})$ and the maximum supply voltage level $(V_{max})$ and a total number of levels m; (2) a minimum supply voltage level $(V_{min})$ and an inter-level voltage spacing $\Delta V$ with a maximum supply voltage level $(V_{max})$ determined by an inter-level voltage spacing $\Delta V$ and a total number of levels m; and (3) a maximum supply voltage level $(V_{max})$ and an inter-level voltage spacing $\Delta V$ with a minimum supply voltage level $(V_{min})$ determined by an inter-level voltage spacing $\Delta V$ and a total number of levels m. In embodiments, the means for providing M power supply voltages comprises a multiple-output supply generator comprising: (1) a multi-regulation stage configured to receive an input voltage and provide multiple independently-regulated output voltages at two or more outputs thereof; and (2) a differential capacitive energy transfer stage which utilizes capacitive energy transfer from at least two of the independently regulated outputs of the multi-regulation stage to synthesize one or more additional outputs whose voltages and/or currents are a function of those provided from the two independently-regulated outputs. In embodiments, the multi-regulation stage is provided as a single-inductor multiple-output (SIMO) power converter. In embodiments, the differential capacitive energy transfer stage is provided as a single- or multiple-output switched-capacitor converter having its input port connected differentially between two outputs of the multi-regulation stage.

In accordance with a still further aspect of the concepts, systems, devices and techniques described herein, a multiple-output supply generator comprises (1) a multi-regulation stage configured to provide multiple independently-regulated output voltages at two or more outputs thereof; and (2) a differential capacitive energy transfer stage which utilizes capacitive energy transfer from at least two of the independently regulated outputs of the multi-regulation stage to synthesize one or more additional outputs whose voltages and/or currents are a function of those provided from the two independently-regulated outputs.

In embodiments, the multiple-output supply generator of claim 20 wherein the multi-regulation stage is provided as a single-inductor multiple-output (SIMO) power converter. In embodiments, the differential capacitive energy transfer stage is provided as a single- or multiple-output switched-capacitor converter having its input port connected differentially between two outputs of the multi-regulation stage.

In accordance with a still further aspect of the concepts, systems, devices and techniques described herein, a system comprises a radio-frequency (rf) amplifier; means, coupled to the rf amplifier, for providing to the rf amplifier m power supply voltages $(V_1 - V_m)$ with two (2) of the m power supply voltages (e.g., $V_1$ and $V_m$) capable of being independently controlled; means for independently controlling the two (2) of the m power supply voltages (e.g., $V_1$ and $V_m$) capable of being independently controlled; and means for distributing the other m−2 power supply voltages in a prescribed relation to the two power supply voltages capable of being independently controlled.

In embodiments, the rf amplifier is a first one of a plurality of rf amplifiers, with at least some of the plurality of rf amplifiers coupled to the means for providing m power supply voltages $(V_1 - V_m)$. In embodiments, the rf amplifier is an rf power amplifier (PA).

In accordance with a still further aspect of the concepts, systems, devices and techniques described herein, a method for operating a system comprising: providing a radio-frequency (rf) amplifier; and (b) providing one or more supply voltages to the rf amplifier PA by independently controlling two (2) of m power supply voltages; and (b) distributing the other m−2 power supply voltages in a prescribed relation to the two independently-controlled power supply voltages such that such that independent control of the two (2) of the m power supply voltages is equivalent to independently specifying or controlling one or more of: (1) a minimum supply voltage level $(V_{min})$ and a maximum supply voltage level $(V_{max})$ with the spacing between the minimum and maximum voltage levels $\Delta V$ determined in terms of the minimum supply voltage level $(V_{min})$ and the maximum supply voltage level $(V_{max})$ and a total number of levels m; (2) a minimum supply voltage level $(V_{min})$ and an inter-level voltage spacing $\Delta V$ with a maximum supply voltage level $(V_{max})$ determined by an inter-level voltage spacing $\Delta V$ and a total number of levels m; and (3) a maximum supply voltage level ($V_{max}$) and an inter-level voltage spacing $\Delta V$ with a minimum supply voltage level ($V_{min}$) determined by an inter-level voltage spacing $\Delta V$ and a total number of levels m.

In embodiments, the rf amplifier may be an rf power amplifier (PA). In embodiments, distributing the other m−2 power supply voltages in a prescribed relation to the two independently-controlled power supply voltages comprises distributing the other m−2 power supply voltages such that the other m−2 power supply voltages are spaced in an even fashion between and/or around the two independently controlled power supply voltages. In embodiments, distributing the other m−2 power supply voltages are spaced in an even fashion between or around the two independently controlled power supply voltages comprises distributing the other m−2 power supply voltages such that adjacent voltage levels each separated by a voltage $\Delta V$. In embodiments, the method may further comprise independently regulating two voltages $V_1$ and $V_m$ and spacing the other m−2 voltages equally between them to provide m power supply voltages $V_k = V_1 + (k-1) - (V_m - V_1)/(m-1)$ for k=1 . . . m. In embodiments, m=3. In embodiments, M=4.

In accordance with a still further aspect of the concepts, systems, devices and techniques described herein, a radio frequency (rf) amplifier system comprising: (a) an rf amplifier having a power supply input; and (b) a multiple-output supply generator coupled to provide a power supply signal to the rf amplifier, the multiple-output supply generator including: (1) a multi-regulation stage configured to provide multiple independently-regulated output voltages at two or more outputs thereof; and (2) a differential capacitive energy transfer stage which utilizes capacitive energy transfer from at least two of the independently regulated outputs of the multi-regulation stage to synthesize one or more additional outputs whose voltages and/or currents are a function of those provided from the two independently-regulated outputs.

In embodiments, the differential capacitive energy transfer stage utilizes capacitive energy transfer from at least two of the independently regulated outputs of the multi-regulation stage to synthesize two or more additional outputs whose voltages and/or currents are a function of those provided from the two independently-regulated outputs. In embodiments, the multi-regulation stage may be provided as a single-inductor multiple-output (SIMO) power converter. In embodiments, the differential capacitive energy transfer stage may be provided as a single- or multiple-output switched-capacitor converter having its input port connected differentially between two outputs of the multi-regulation stage. In embodiments, the rf amplifier system further comprises a supply modulator having multiple inputs and at least one output, the supply modulator having inputs coupled to outputs of said multiple-output supply generator and an output coupled to the power supply input of said rf amplifier. In embodiments, the supply modulator comprises a switch network configured to selectively couple ones of the supply generator outputs to the rf amplifier power supply input. In embodiments, the rf amplifier system further comprises a filter disposed between the output of the supply modulator and the power supply input to said rf amplifier. In embodiments, the rf amplifier system further comprises: (a) a second rf amplifier having a power supply input; (b) a second supply modulator having multiple inputs coupled to outputs of said multiple-output supply generator and an output coupled to the power supply input of said second rf amplifier.

In accordance with a still further aspect of the concepts, systems, devices and techniques described herein, in a system having m power supply voltages ($V_1$-$V_m$), a method to generate a set of supply voltages comprising: (a) independently controlling two (2) of the m power supply voltages (Vx and Vy where x, y are both in the range of 1-m); and (b) distributing the other m minus two (m−2) power supply voltages in a prescribed relation to the two independently-controlled power supply voltages such that independent control of the two (2) of the m power supply voltages is equivalent to independently specifying or controlling one or more of: (1) a minimum supply voltage level ($V_{min}$) and a maximum supply voltage level ($V_{max}$) with the spacing between the minimum and maximum voltage levels $\Delta V$ determined in terms of the minimum supply voltage level ($V_{min}$) and the maximum supply voltage level ($V_{max}$) and a total number of levels m; (2) a minimum supply voltage level ($V_{min}$) and an inter-level voltage spacing $\Delta V$ with a maximum supply voltage level ($V_{max}$) determined by an inter-level voltage spacing $\Delta V$ and a total number of levels m; and (3) a maximum supply voltage level ($V_{max}$) and an inter-level voltage spacing $\Delta V$ with a minimum supply voltage level ($V_{min}$) determined by an inter-level voltage spacing $\Delta V$ and a total number of levels m; (4) a minimum ($V_{min}$) supply voltage level; (5) a maximum ($V_{max}$) supply voltage level; (6) an inter-level voltage spacing $\Delta V$; (7) a minimum supply voltage level ($V_{min}$) and an inter-level voltage spacing $\Delta V$; and (8) a maximum supply voltage level ($V_{max}$) and an inter-level voltage spacing $\Delta V$.

In accordance with a still further aspect of the concepts, systems, devices and techniques described herein, a system comprises: (a) a multi-output supply generator configured to provide m power supply voltages ($V_1$-$V_m$); (b) a supply modulator system coupled to the multi-output supply generator, the supply modulator system configured to generate a set of supply voltages independently control two (2) of the m power supply voltages (Vx and Vy where x, y are both in the range of 1-m); and (c) a differential capacitive energy stage configured to provide charge transfer to automatically distribute the other m minus two (m−2) power supply voltages in a prescribed relation to the two independently-controlled power supply voltages such that independent control of the two (2) of the m power supply voltages is equivalent to independently specifying or controlling one or more of: (1) a minimum supply voltage level ($V_{min}$) and a maximum supply voltage level ($V_{max}$) with the spacing between the minimum and maximum voltage levels $\Delta V$ determined in terms of the minimum supply voltage level ($V_{min}$) and the maximum supply voltage level ($V_{max}$) and a total number of levels m; (2) a minimum supply voltage level ($V_{min}$) and an inter-level voltage spacing $\Delta V$ with a maximum supply voltage level ($V_{max}$) determined by an inter-level voltage spacing $\Delta V$ and a total number of levels m; and (3) a maximum supply voltage level ($V_{max}$) and an inter-level voltage spacing $\Delta V$ with a minimum supply voltage level ($V_{min}$) determined by an inter-level voltage spacing $\Delta V$ and a total number of levels m.

In embodiments, distributing the other m−2 power supply voltages in a prescribed relation comprises using the differential switched-capacitor circuit to automatically distribute the other m−2 power supply voltages.

BRIEF DESCRIPTION OF THE DRAWINGS

The foregoing features may be more fully understood from the following description of the drawings in which.

DETAILED DESCRIPTION

Figure 1A:
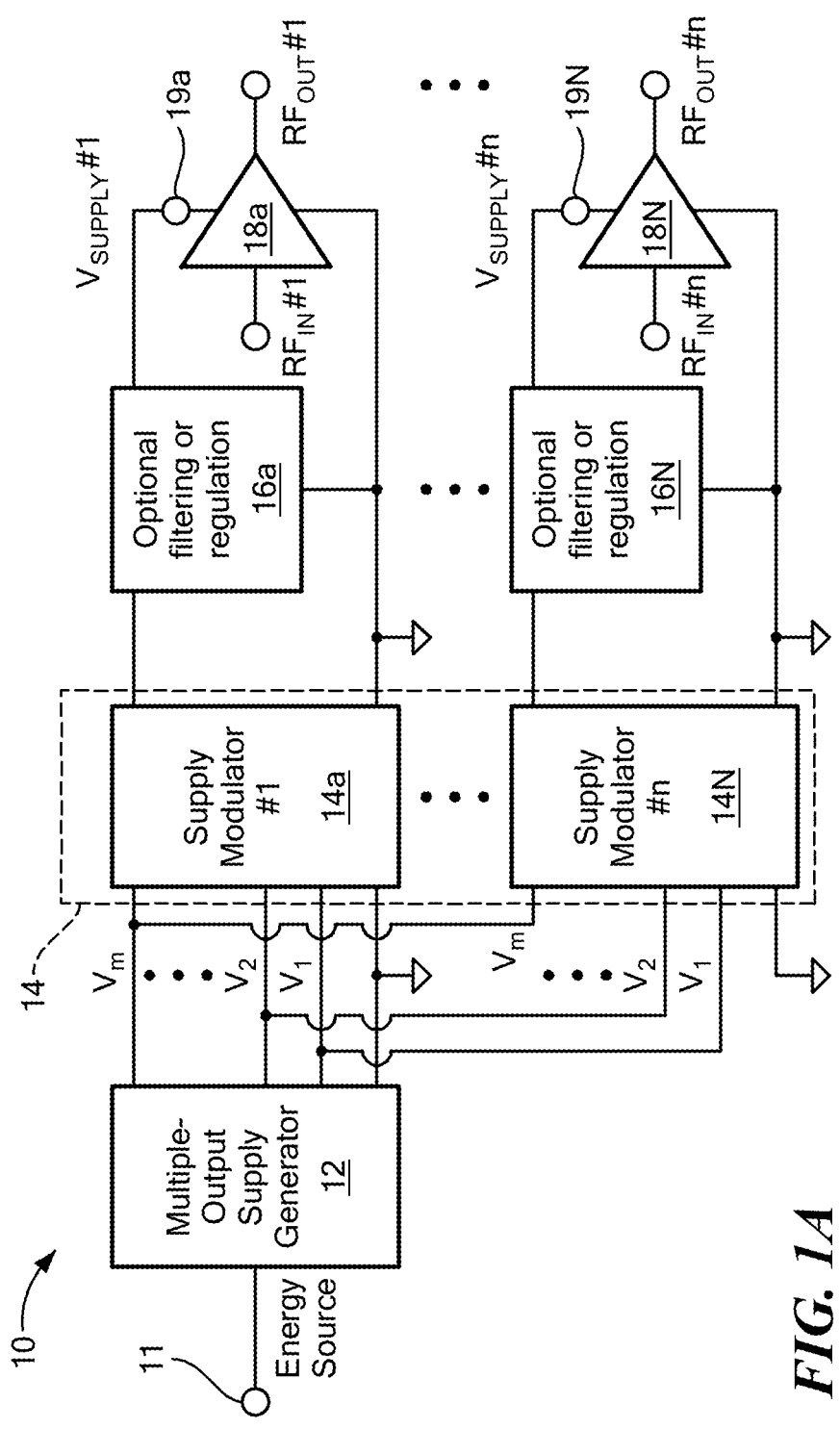
FIG. 1A is a block diagram of an RF power amplifier system utilizing multiple supply levels and illustrating a system architecture including supplying multiple power amplifiers.

Referring now to FIG. 1A, a radio frequency (rf) amplifier system 10 utilizing supply modulation wherein a supply modulator subsystem 14 switches among multiple voltages generated by a supply generator 12. (Not shown are aspects of signal processing and control for such a system). FIG. 1A is an example implementation of an architecture which is especially suitable for discrete supply modulation.

The rf power amplifier system 10 includes a multiple output supply generator subsystem (or more simply a "supply generator") 12 that can synthesize multiple power supply voltages V1-Vm from a single input source 11. In embodiments, supply generator 12 may regulate one or more of power supply voltages V1-Vm. Supply generator 12 provides one or more of the voltages V1-Vm, to inputs of one or more supply modulators subsystems (or more simply "supply modulators") 14a-14N of a supply modulator system 14. Supply modulators 14a-14N can switch (and ideally, rapidly switch) among the different power supply voltages provided thereto by supply generator 12 to thus provide modulated supply voltages $V_{supply\ \#1}$-$V_{supply\ \#N}$ at an output thereof. Switches may be modulated sufficiently rapidly to provide a power supply voltage to the power amplifier such that the rf amplifier can provide the required rf output envelope while maintaining high efficiency, in accordance with techniques known in the art as discrete drain modulation, envelope tracking advanced (ETA), discrete envelope tracking, and digital envelope tracking (digital ET). Such techniques are described, for example, in one or more of U.S. Pat. Nos. 8,829,993; 9,160,287; 9,166,536; 9,172,336; 9,209,758; 9,755,672. The supply voltage inputs may be coupled to supply terminals of respect ones of one or more rf amplifiers 18a-18N. In some embodiments, rf amplifiers may be provided as rf power amplifiers (PAs). In embodiments, supply generator 12 may supply the same or different voltages to supply modulators 14. In embodiments, supply generator 12 a different number of voltages may be coupled between supply generator 12 and supply modulators 14.

In embodiments, some or all of the supply voltages may be coupled to the supply terminals of the rf amplifiers through respective ones of optional filtering or voltage regulation stages 16a-16N. filtering/regulation stages 16a-16N may comprise filtering networks, including passive filters and/or active filters and/or additional means of regulating the voltage (e.g., including low-dropout regulator(s), LDOs) to the rf amplifier $v_{supply}$ from the modulated voltage $v_{mod}$.

The manner in which subsystems 12 14 are best realized may depend upon a variety of factors including, but not limited to: the power level (i.e. the level of rf power provided at the output of the rf amplifier), voltage level (e.g. the voltage levels of energy source 11 and range the level of voltages provided at the output of supply generator 12) and application space of the rf amplifier system 10 (i.e. the particular application in which rf amplifier system 10 will be used). It should, however, be appreciated that for many mobile applications (e.g. wireless system such as cell phones, cell phone base stations, wireless personal computing devices such as laptop computers or tablet computers, to name but a few examples), it may be desirable to monolithically integrate electronic elements of both the supply generator and supply modulator on a single semiconductor die (e.g., in a complementary metal oxide semiconductor (CMOS) process). Furthermore, in some cases it may be desirable to integrate electronics for the supply generator, supply modulator(s) and power amplifiers on a single die. In other cases, it may be desirable to realize the semiconductor elements supply generator and (one or more) supply modulators on separate semiconductor dies to enable better placement of these elements within a system module. In yet other cases (especially at high power) it may be desirable to implement the subsystems with discrete components connected on one or more printed circuit boards.

In embodiments, one, some or all of the supply modulator subsystems $14a$-$14$N may comprise one or more switches to couple one or more voltages provided by supply generator 12 to rf amplifier supply terminals $19a$-$19$N. A variety of different switching circuits (i.e. switches having a wide a variety of switch configurations or switch topologies) may be utilized to realize supply modulator subsystems 14. For example, in embodiments, a supply modulator subsystem may comprise, a plurality of serially coupled switches configured to provide a "series" modulator. Alternatively, in embodiments, a supply modulator subsystem may comprise a plurality of parallel coupled switches configured to provide a "parallel" modulator. Alternatively still, in embodiments, a supply modulator subsystem may comprise one or more serially coupled switches and one or more parallel coupled switches.

Of importance to the concepts described herein is how the voltages that are synthesized by the supply generator affect the required ratings of the switches in the one or more supply modulators $14a$-$14$N. This is one important consideration as the required voltage ratings of the modulator switches can influence (and in some cases, highly influence) switching speed (and achievable modulation rate) and modulator efficiency, both of which are significant system factors. Regardless of the modulator switch topology used, if there are m supply levels ordered in increasing voltage $v_1, \ldots, v_m$ (i.e. $v_1 < v_2 < \ldots < v_m$ the plurality (or chain) of switches coupled between the $j^{th}$ supply voltage $v_j$ and the output $v_{mod}$ should ideally be rated to block at least a negative voltage of magnitude $(v_m - v_j)$ and a positive voltage that is either $(v_j - v_1)$ or v; depending upon whether the modulator sources a lowest voltage $v_1$ or should ideally be able to directly supply zero volts to the rf amplifier. In some embodiments having designs of the latter type, where the power supply provided to the power amplifier needs to be "cut off" (discharged to a zero volt power supply), a separate low-frequency "turn off" switch can be advantageously placed in series with the output of a supply modulator capable of sourcing modulator output voltages $v_1, \ldots, v_m$. Such a cutoff switch can reduce the modulator switch chain voltage blocking requirements from $v_j$ to $(v_j - v_1)$; this can be especially advantageous for modulator design. As will be seen below, the described concepts provide a natural means to control the voltages $v_1, \ldots, v_m$ such that the modulator switching network can be realized in a desirable fashion.

In some embodiments an rf power amplifier system such as rf power amplifier system 10 may comprise a "series" modulator in a form suitable for integrated circuit fabrication and for use with ratiometric supply voltages (e.g., $V_2 = 2V_1$, $V_3 = 3V_1$, $V_4 = 4V_1$). Such a design illustrates the impact of the supply levels on the required voltage rating of individual modulator devices; by correct selection of the level voltages, the best use of integrated CMOS processes can be made using both core devices and extended voltage devices to achieve the required voltage blocking characteristics of the modulator switch chains. Moreover, such a circuit illustrates the use of the generated levels for gate drive of the devices. This type of drive approach facilitates high efficiency and switching speed. However, to take advantage of driving the device gates between adjacent level voltages (e.g., between $V_j$ and $V_{j-1}$), level voltages for this design should be maintained with sufficient spacing; otherwise, more sophisticated gate drive designs may be needed that can limit achievable switching performance. As described below, the concepts described herein facilitate maintaining voltage levels that are suitable for achieving integrated-circuit based modulators and high-performance gate drives through the ability to maintain desired voltage relationships among the levels.

Prior-art supply generators have been realized through a variety of methods. Supply generators have been realized using multiple separate converters, multiple-output magnetic converters, multiple-output switched-capacitor converters and hybrid magnetic/switched-capacitor converters providing a ratiometric set of output voltages. Each of these prior approaches has substantial limitations that limit the achievable size, cost, efficiency, and performance (e.g., modulation bandwidth) of supply-modulated rf amplifier systems.

Use of multiple separate power converters to generate the multiple supply voltages yields a solution that is extremely flexible, allowing each output voltage to be independently regulated to desired values independent of input voltage variations and providing the ability to continuously adjust the output voltages over time (e.g., to provide for adaptive bias of the power amplifier). Unfortunately, this solution is inherently large and expensive, owing to the large numbers of physically-large power supply components (especially magnetic components) required. Single-inductor multiple-output converters, sometimes called "SIMO" converters allow multiple output voltages to be independently regulated while only requiring a single magnetic component, somewhat mitigating the size challenge of multiple power converters. However, as SIMO designs inherently utilize time-sharing of the inductor to supply the multiple outputs, performance and efficiency degrade quickly and control complexity increases quickly with increasing numbers of outputs. This characteristic limits the efficacy of this approach in multi-level supply modulator systems, which typically utilize between three and seven supply levels to achieve high performance (with even more levels potentially desirable in some cases).

Some types of converters, such as conventional multiple-output magnetic converters (e.g., multi-output flyback converters), multiple-output switched-capacitor converters and hybrid magnetic/switched-capacitor converters yield multiple ratiometrically-related output voltages while reducing the numbers of magnetic components required as compared to using multiple independent power converters. Traditional multiple-output magnetic converters typically utilize transformers with scaled turns ratios to generate multiple (ideally) ratiometrically-scaled output voltages. These designs can only usually regulate a single output, with the ratiometric relations of the other outputs approximately maintained by the transformer turns ratios (unless additional "post regulation" is provided the other outputs, such as through use of added linear regulators.) The use of transformers tends to hurt achievable efficiency in these designs (often to unacceptable levels), and such designs often suffer significant cross regulation among the outputs in practice (i.e., one output voltage varying depending upon the load on a different output) which gives undesirable performance in rf amplifier systems unless additional "post" regulation is used (which further hurts performance).

Multiple-output switched-capacitor converter circuits can generate multiple ratiometrically-related output voltages while achieving very high efficiency and small size, with the rational (ideal) ratios among output voltages determined by the circuit topology and/or switching pattern. However, with this type of circuit, the output voltages are all scaled versions of the input voltage, which doesn't provide a means to continuously regulate the output voltages independent of variations in the input voltage; this may be a significant disadvantage in many systems.

Some limitations of these previous approaches to multiple-output supply generation can be realized via hybrid magnetic/switched-capacitor circuits having ratiometrically-scaled outputs. In these designs, a magnetic regulation stage independently regulates a single output voltage (independent of the system input voltage) with additional ratiometrically-related output voltages synthesized and enforced through the action of a switched-capacitor voltage balancer stage. For example, in an m-output supply generator, the magnetic stage may take an input voltage $V_X$ and regulate a single output voltage $V_Y$, with the switched capacitor voltage action synthesizing (ideally) voltages $k_1 \cdot V_Y$, $k_2 \cdot V_Y$, . . . , $k_{m-1} \cdot V_Y$, where constants $k_1$, . . . , $k_{m-1}$ are rational numbers determined by the circuit topology and/or switching pattern. Advantages of this approach include relatively high efficiency and small size requirements for synthesizing multiple related output voltages and relative simplicity of control.

Merits of the above design approaches notwithstanding, all designs yielding ratiometric supply generator voltage outputs have limitations (and in some cases, significant limitations) for power amplifier systems utilizing multiple level supply modulation. A first limitation of ratiometric outputs relates to the useable supply voltage ranges for available power amplifiers. Some power amplifiers may function well with wide supply voltage ranges of up to 4:1 or even larger (e.g., function well across a power supply voltage range from a maximum voltage of $V_{max}$ down to a minimum voltage equal to or less than $V_{min}=V_{max}/4$.) Many other power amplifiers—including those typically used in applications such as Wi-Fi, mobile handset, and MIMO transmitters for LTE and 5G applications—can only operate over much narrower supply voltage ranges (e.g., 3:1 or even less). With ratiometric supply voltages, if the maximum voltage generated is reduced (e.g., for conditions of reduced average PA output power) then the synthesized ratiometric voltages are all reduced proportionately. This often means that one or more of the lowest synthesized voltages will become unusable for supply modulation under such conditions, as they fall below the allowed minimum PA power supply voltage. This in turn reduces the achievable PA efficiency enhancement that can be provided through supply modulation under these conditions. It would be much more desirable if the power supply voltages were not maintained as a fixed set of ratios, such that all (or nearly all) of the synthesized supply voltage levels remained above the allowed minimum voltage for the PA under reduced power operation.

A second limitation of ratiometric outputs relates to how the spacing between voltages varies as the largest supply voltage synthesized is reduced. In a ratiometric-output supply generator, two adjacent voltages may be $k_j \cdot V_Y$ and $k_{j-1} \cdot V_Y$, where the value of $V_Y$ may be scaled up or down via a scaling factor $k_j$ as the average transmit power of the PA is adjusted. The difference between voltage levels is thus $(k_j-k_{j-1}) \cdot V_Y$ which scales up and down proportional to $V_Y$. As described above, this can be problematic for driving of integrated modulator switches, especially where the gate drive voltages are derived from interlevel voltages (voltage differences between levels). This can drive greatly increased gate drive complexity in an integrated modulator and can also limit achievable switching performance of the modulator. It would be much more desirable if the power supply voltages were not maintained as a fixed set of ratios, such that the spacing between adjacent levels could be controlled independently of the maximum supply voltage synthesized.

For power amplifier architectures such as shown in FIG. 1A, it would desirable to be able to provide a system that can provide both very rapid (e.g., on the time scale of the rf envelope or approaching within an order of magnitude of the time scale of the rf envelope, or sufficiently fast for purposes of discrete tracking of the envelope) variations in power supply voltage (e.g., among multiple discrete levels) while also providing the ability to slowly adapt (e.g., on a time scale associated with rf data traffic variations, with positional variations among transmitters and receivers, or as typically used in the art for adaptive bias of the power amplifiers) the voltages of the discrete levels over a desired range. (For example, rapidly modulating the supply voltage on time scales shorter than a microsecond or alternatively shorter than 100 ns and adapting supply voltages on a time scale long compared to a microsecond or alternatively longer than 10 microseconds.) Those of ordinary skill in the art will appreciate that switching time scales may be application specific, at least to some extent. In embodiments, it may be describable to switch on the order of 10 ns or even below. The same is, of course, also true with respect to the ability to adapt voltages of the discrete levels over a desired range. In particular, it would be useful to be able to efficiently and compactly generate a set of power supply voltages in which one could independently control two of m power supply voltages (e.g., a first power supply voltage $V_1$ and a second power supply voltage $V_m$), with the other m–2 power supply voltages distributed in some prescribed relation to the two independently-controlled power supply voltages, such as spaced in an even fashion between them and/or around them (e.g., with adjacent voltage levels each separated by a voltage $\Delta V$). For example, if one were able to independently regulate voltages $V_1$ and $V_m$ and space the other m–2 voltages equally (or substantially equally) between them, one would have m power supply voltages $V_k=V_1+(k-1) \cdot (V_m-V_1)/(m-1)$ for k=1 . . . m where m is the maximum number of voltage levels. Such an arrangement is equivalent to allowing one to independently specify or control:

(a) Minimum ($V_{min}$) and maximum ($V_{max}$) voltage levels (with the spacing between voltage levels $\Delta V$ determined in terms of $V_{min}$ and $V_{max}$ and the total number of levels m).

(b) The minimum supply voltage level ($V_{min}$) and the inter-level voltage spacing $\Delta V$ (with the maximum voltage level $V_{max}$ determined by $\Delta V$ and the total number of levels m.)

(c) The maximum supply voltage level ($V_{max}$) and the inter-level voltage spacing $\Delta V$ (with the minimum voltage level $V_{min}$ determined by $\Delta V$ and the total number of levels m.)

Figure 1B:
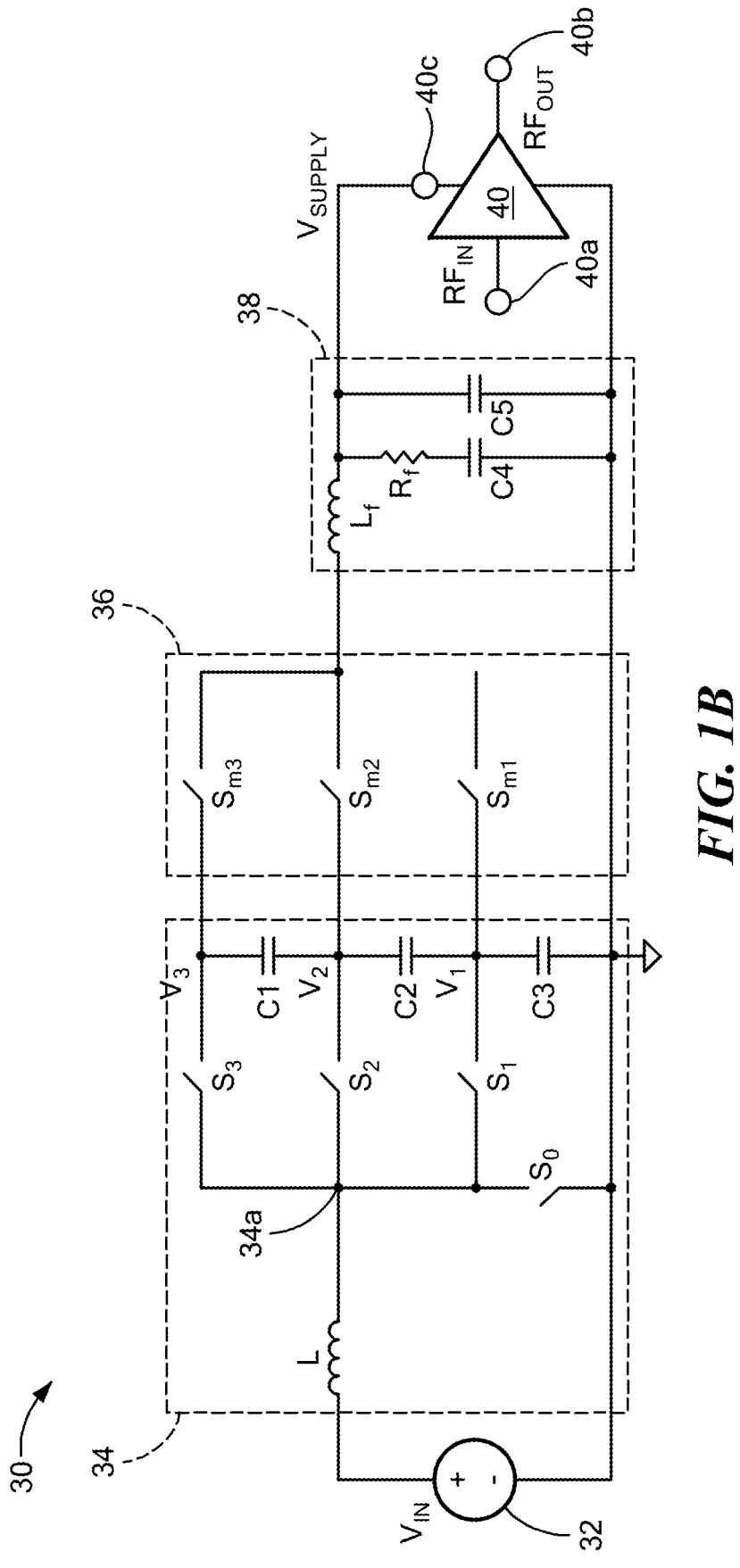
FIG. 1B is a block diagram of an example system implementation including a single-inductor multiple-output boost converter as a supply generator, a "parallel" supply modulator and an LC filter.

While not quite as flexible as truly independent control of all voltages (e.g., as achievable with the design of FIG. 1B, most of the practical benefits available from supply modulation (e.g., in terms of power amplifier efficiency) would be gained while avoiding the above-described limitations associated with providing truly independent voltage level control or ratiometric levels. Thus, a design in accordance with the above approach would provide significant advantages in combinations of size, cost, efficiency, and performance as compared to existing approaches.

Referring now to FIG. 1B, an rf amplifier system 30 comprises a multiple output supply generator 34 a supply modulator 36 and optional filter 38 and an rf amplifier 40 having an rf input 40a, an rf output 40b and a supply terminal 40c. In this example embodiment, supply generator 34 is provided as a single inductor 3-output boost converter comprising an inductor L having a first terminal coupled to a voltage supply 32 and a second terminal coupled to a node 34a. One or more switches (here three switches S1, S2, S3) have a first terminal coupled to node 34a and a second terminal coupled to at least one voltage node established via capacitor stack C1, C2, C3, C4 (e.g. a plurality of capacitors C1, C2, C3, C4 serially coupled between a first voltage node and ground so as to establish a plurality of voltage nodes V1-V3). A fourth switch S0 has a first terminal coupled to node 34a and a second terminal coupled to ground. In the example embodiment of FIG. 1A, the second terminal of switches S1, S2, S3 are coupled to respective ones of voltage nodes V1, V2, V3.

Also in this example embodiment, power supply modulator comprises a plurality of switches $S_{m1}$-$S_{m3}$ with a first terminal of each switch $S_{m1}$-$S_{m3}$ coupled to a corresponding one of voltage terminals V1-V3 and a second terminal of each switch $S_{m1}$-$S_{m3}$ coupled to a node 36a.

In this example embodiment, node 36a is coupled to supply terminal 40c of rf amplifier 40 though filter 38. In this example, filter 38 is provided as an LC filter comprising inductor Lf, resistor Rf and capacitors C4, C5. In other embodiments, node 36a may be coupled to supply terminal 40c of rf amplifier 40 through other circuitry (i.e. circuitry other than filter circuitry). In still other embodiments, node 36a may be directly coupled to supply terminal 40c of rf amplifier 40.

Figure 2:
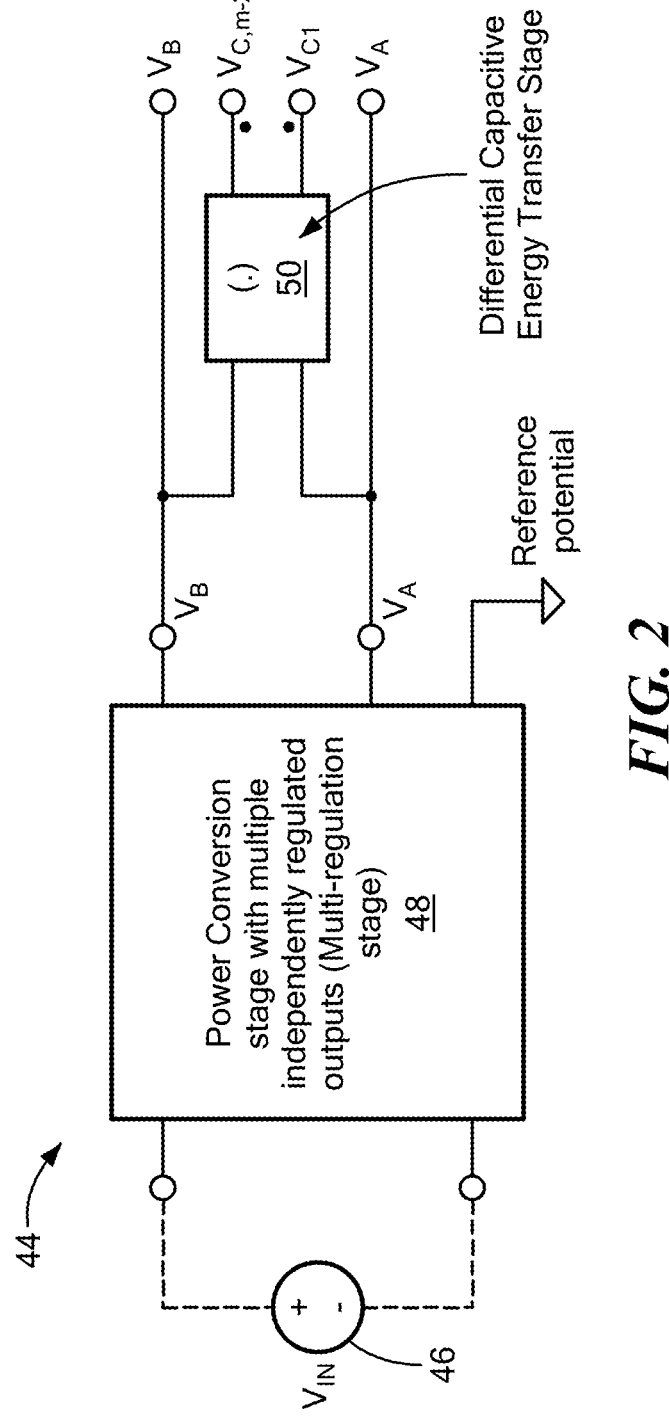
FIG. 2 is a block diagram of a system architecture of the proposed multiple-output supply generator for use as part of the rf amplifier system of FIG. 1.

Referring now to FIG. 2, a supply generator 44 comprises a power conversion stage 48 configured to receive an input voltage from a voltage source 46. Here voltage source 46 is shown phantom since it is not properly a part of supply generator 44. Supply generator 44 comprises a power conversion stage having multiple independently regulated outputs and thus may be referred to as a multi-regulation stage.

Power conversion stage 48 has outputs coupled to inputs of a differential capacitive energy transfer stage 50. In this example embodiment, differential capacitive energy transfer stage 50 receives voltages $V_A$, $V_B$ from power conversion stage 48 and provides voltages $V_{C,M-2}$, $V_{C1}$ at outputs thereof. Thus, FIG. 2 illustrates an architecture for a supply generator in accordance with the concepts described. A multiple-output supply generator is suitable for use as part of an rf amplifier system (e.g. as illustrated in FIGS. 1A,1B).

Figure 3:
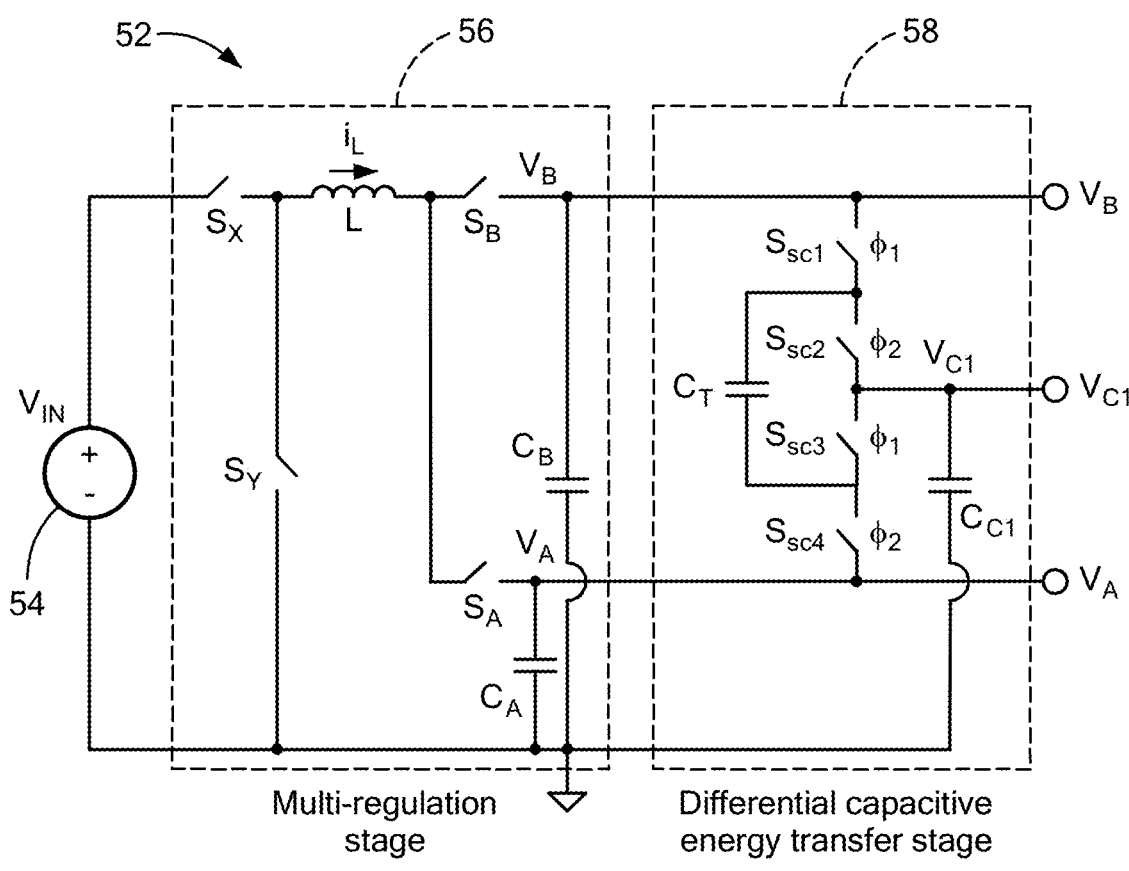
FIG. 3 is a schematic diagram of an example implementation of the proposed multiple-output supply generator for use as part of the rf amplifier system of FIG. 1.

Referring now to FIG. 3 an example implementation of a supply generator 52 comprising a power conversion stage 56 with multiple independently-regulated outputs (which may sometimes be referred to herein as a "multi-regulation stage") and a power converter stage 58, (which may sometimes be referred to herein as a "differential capacitive energy transfer stage" or more simply a "DCT stage") which utilizes capacitive energy transfer from at least two of the independently regulated outputs of the multi-regulation stage 56 to synthesize one or more additional outputs whose voltages and/or currents are a function of those provided from the two independently-regulated outputs. The multi-regulation stage may be preferentially implemented as a single-inductor multiple-output (SIMO) power converter, while the differential capacitive energy transfer stage may be preferentially implemented as a single- or multiple-output switched-capacitor converter having its input port connected differentially between the two outputs of the multi-regulation stage.

FIG. 3 thus shows one example implementation of a multiple-output supply generator. In this implementation, the multi-regulation stage is realized as a single-inductor dual-output buck converter, in which switches $S_X$ and $S_Y$ allow controlled buck regulation from the input voltage $V_{IN}$ and modulation between switches $S_A$ and $S_B$ allows time sharing of inductor current $i_L$ to provide independent regulation of voltages $v_A$ and $V_B$ with respect to a reference potential (via feedback and control means not illustrated). The differential capacitive energy transfer stage is realized as a switched-capacitor (SC) circuit having its input connected between $v_A$ and $v_B$ and providing a single output $v_{C1}$. The SC circuit switches in two phases, alternately switching energy transfer capacitor $C_T$ to connect between $v_A$ and $v_{C1}$ (switches φ1 on and φ2 off) and to connect between $v_B$ and $v_{C1}$ (switches φ1 off and φ2 on). The operation of the differentially-connected switched-capacitor converter enforces that current provided at the output of the switched-capacitor circuit $v_{C1}$ is equally drawn from the two inputs to the switched-capacitor circuit (i.e., equally drawn from $v_A$ and $v_B$). The steady-state open circuit output voltage condition for this switched-capacitor circuit is $v_{C1}=(v_A+v_B)/2$, and voltage $v_{C1}$ remains near this open circuit output voltage condition when operated at high efficiency (limited by the output voltage droop of the $S_C$ circuit as is known for switched-capacitor systems.) Thus, this multiple output supply generator system can synthesize three voltages: independently regulated voltages $v_A$ and $v_B$ and a third voltage $v_{C1}=(v_A+v_B)/2$ (in which current provided to the output $v_{C1}$ is sourced equally from $v_A$ and $v_B$.).

As explained herein, switches Sx, Sy are pulse-width modulated (i.e. controlled or switched) at some frequency with a duty ratio to generate an average voltage at the left terminal of inductor L to regulate the output voltages. Switches, $S_A$ and $S_B$ pulse width modulate with duty ratios to provide the proper distributions of currents to nodes $V_A$ and $V_B$ to regulate them (so $S_X/S_Y$ and $S_A/S_B$ duty ratios act to allow proper regulation of voltages $V_A$, $V_B$. Switches labeled $^Φ1$ and $^Φ2$ switch in a complementary fashion (switches labelled $^Φ1$ switch on when switches labelled $^Φi2$ switch off and vice versa), typically at a defined switching frequency, to provide $S_C$ charge transfer to keep voltage Vc1 near the target voltage, with the frequency of switching rather than the duty ratio between $^Φ1$ and $^Φ2$ as most important.

It will be appreciated that a wide variety of topological approaches can be realized for the multi-regulation stage.

Figure 4:
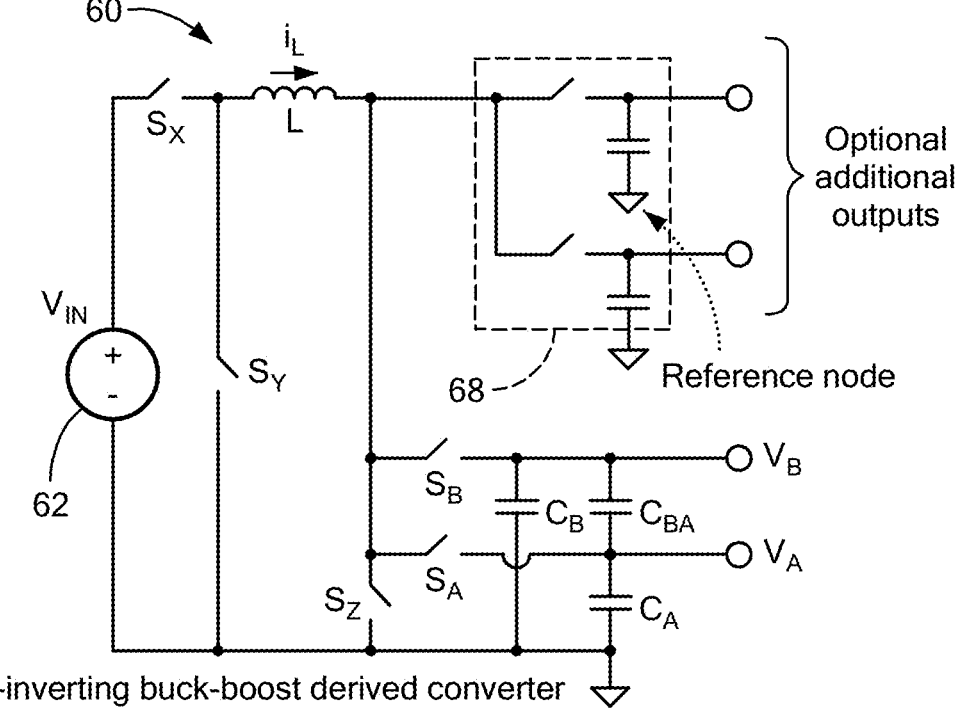
FIG. 4 is a schematic diagram of a multi-regulation stage.

For example, and referring now to FIG. 4, shown is a multi-regulation stage based on a non-inverting buck-boost converter 60. By modulating switches $S_X$, $S_Y$, $S_Z$, $S_A$ and $S_B$ this topology can independently regulate voltages $V_A$ and $V_B$ to values above and/or below that of voltage $V_{IN}$. This topology may, for example, be useful in situations in which an input voltage (as may be provided by a battery, for example) and/or the output voltages vary over wide ranges such that the relative amplitudes of the input and output voltages cross one another. As illustrated, by adding switches and further time-sharing the inductor current, optional additional outputs can be supplied and independently regulated. This is valuable when one may need to supply one or more additional outputs or to supply an additional pair of outputs to support a second differential capacitor energy transfer stage and supply modulator. However, such introduction of additional outputs comes at the cost of reduced efficiency and transient performance and increased complexity of controlling the multi-regulation stage. Additional outputs can similarly be provided with other multi-regulation stage topologies.

A multi-regulation stage topology may be derived from a boost converter, for example. Such a topology may be useful when at least one of the output voltages is continuously maintained above the input voltage. For such applications such a topology has the advantage of providing direct energy conversion with the inductor current only needing to pass through one switch at any given time, reducing conduction loss.

A multi-regulation stage may also be derived from an inverting buck-boost converter. Such a topology may be valuable when the input source voltage is negative with the positive terminal of the input source connected to an output reference node, as is common in many telecommunications applications (e.g., having a −48 V nominal input). Such a topology may also provide the benefit that the regulated output voltages can have amplitudes that are smaller, larger or the same as the input voltage amplitude, as with the non-inverting design described above in conjunction with FIG. 4. However, unlike the topology of FIG. 4 it provides no direct energy transfer from the source to the outputs. It will be appreciated that many other approaches for the multi-regulation stage can be used, including those derived from single-inductor dual-output (SIDO) dc-dc converters (or, more generally, single-inductor multiple-output, or SIMO dc-dc converters), other dual-output converters with independent output voltage controls and derived from the use of multiple independent converters to regulate a pair of voltages $V_A$ and $V_B$.

Figure 5A:
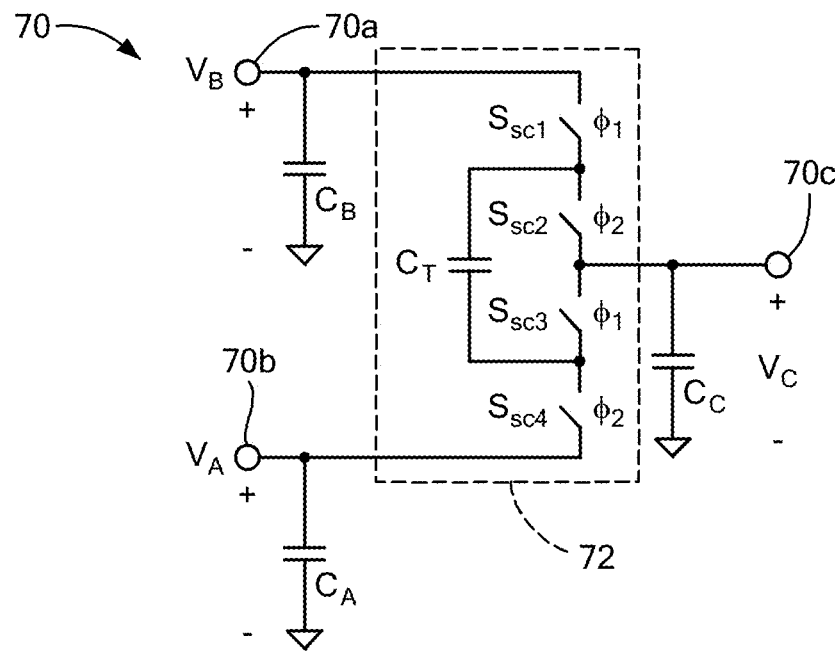
FIG. 5A is a schematic diagram of a differential capacitive energy transfer stage for generating an output voltage $v_C$ that is intermediate between voltages $v_A$ and $v_B$.

The differential capacitive energy transfer stage used in FIG. 3, which may also be referred to as a "differential switched-capacitor" stage, or DSC stage, is shown again in FIG. 5A. As described above, in this topology, this differentially-connected switched-capacitor circuit 70 topology draws the current provided to output $v_C$ equally from $v_A$ and $v_B$, and maintains the output voltage $v_C$ approximately equal to a value corresponding to the mean value of $v_A$ and $v_B$. This design can be modeled using techniques known for the analysis of switched-capacitor circuits.

Figure 5B:
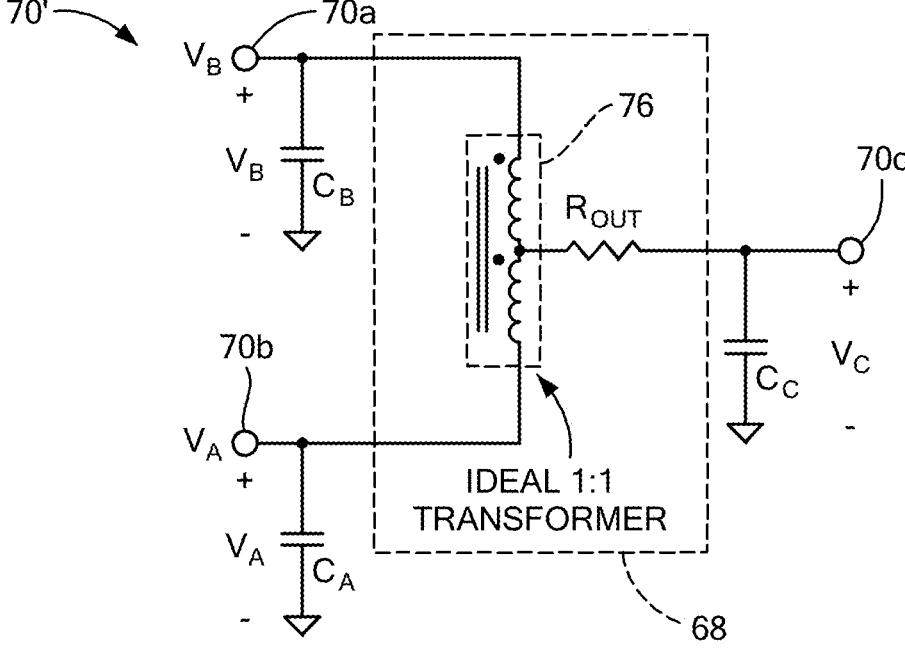
FIG. 5B is a schematic diagram of a circuit model representing the operational characteristics of this design.

A circuit model 70' for DSC stage 70 (FIG. 5A) is shown in FIG. 5B, where ideal transformer captures the current transfer and ideal open-circuit voltage of the stage and resistor $R_{out}$ represents the loss and droop in output voltage from charging and discharging of the energy transfer capacitor $C_T$. In embodiments transformer 76 represents an ideal 1:1 transformer. It can be shown that in the slow switching limit (i.e., when the switching period of the differential switched capacitor converter is long compared to the time constant associated with charging/discharging the capacitor such that the capacitor substantially complete its voltage charge/discharge within the switched-capacitor switching period, as is known in the art.) the effective output resistance $R_{out}$ for this example design is $1/(4 \cdot f \cdot C_T)$, where f is the switching frequency at which the DSC circuit is operated and $C_T$ is the value of the energy transfer capacitance. In the fast switching limit (i.e., when the switching period of the differential switched capacitor circuit is short compared to the time constant associated with charging/discharging the energy transfer capacitor such that the capacitor is far from completing its charge/discharge within a switching cycle) $R_{out}$ becomes $R_{CT}+2 \cdot R_{sw}$ where $R_{CT}$ is the equivalent series resistance of energy transfer capacitor $C_T$ and $2 \cdot R_{sw}$ represents the total resistance of the two switches through which current charges or discharges capacitor $C_T$.

Figure 6:
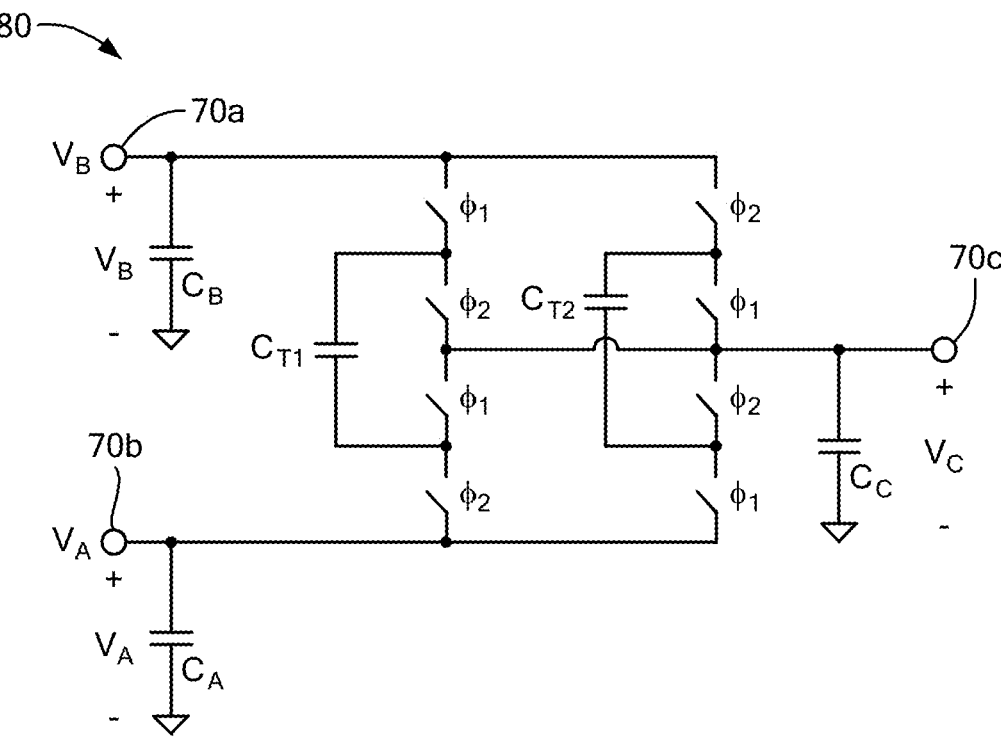
FIG. 6 is a schematic diagram of a differential capacitive energy transfer stage for generating an output voltage $v_C$ that is intermediate between voltages $v_A$ and $v_B$.

The differential capacitive energy transfer stage can be realized in a variety of different ways, each with its own benefits and limitations. FIG. 6, for example shows an interleaved DSC design providing similar functionality to that in FIG. 3, but with an interleaved differential switched-capacitor circuit structure. The interleaved differential switched-capacitor circuit structure reduces the switching ripple current drawn from $v_A$ and $v_B$ as compared to the non-interleaved design of FIG. 5A for the same switching frequency and total capacitance. This interleaved design requires more switches, capacitors, and interconnects than the non-interleaved version of FIG. 5A but reduces the switching ripple current drawn by the switched-capacitor circuit from $v_A$ and $v_B$, which can reduce electromagnetic interference and help improve efficiency. Other differential capacitive energy transfer stage designs can likewise benefit from interleaving. Moreover, while the illustrated design uses a two-phase switching approach, it will be appreciated that more switching phases can be used, and appropriate interleaving of multiple phases can likewise be advantageously adopted in such cases.

It will be appreciated that while the differential capacitive energy transfer stages of FIGS. 5A, 5B, 6 provide a single output $v_C$, appropriate designs can generate any number of outputs required, distributed between and/or about $v_A$ and $v_B$.

Figure 7B:
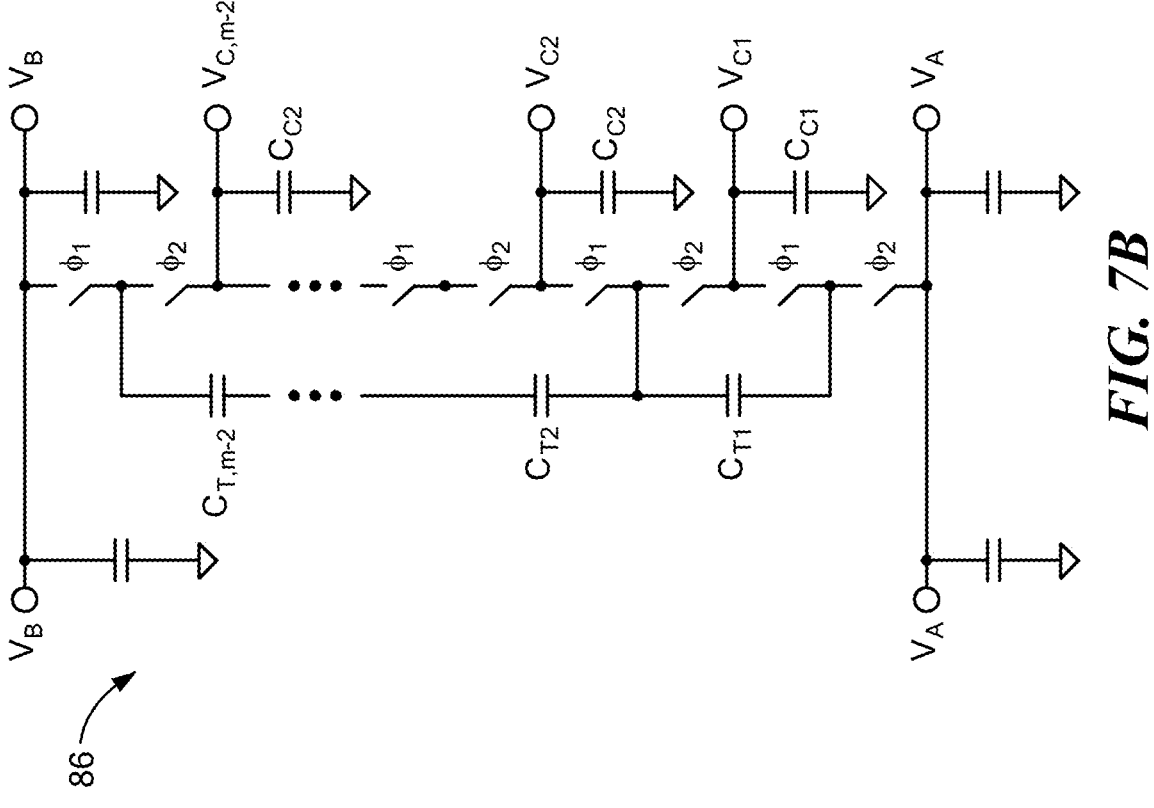
FIG. 7B is a schematic diagram of a differential switched-capacitor ladder structure showing that the structure of FIG. 7A can be extended to provide additional outputs by using additional stacked energy transfer capacitors and half-bridge switching circuits.
Figure 7A:
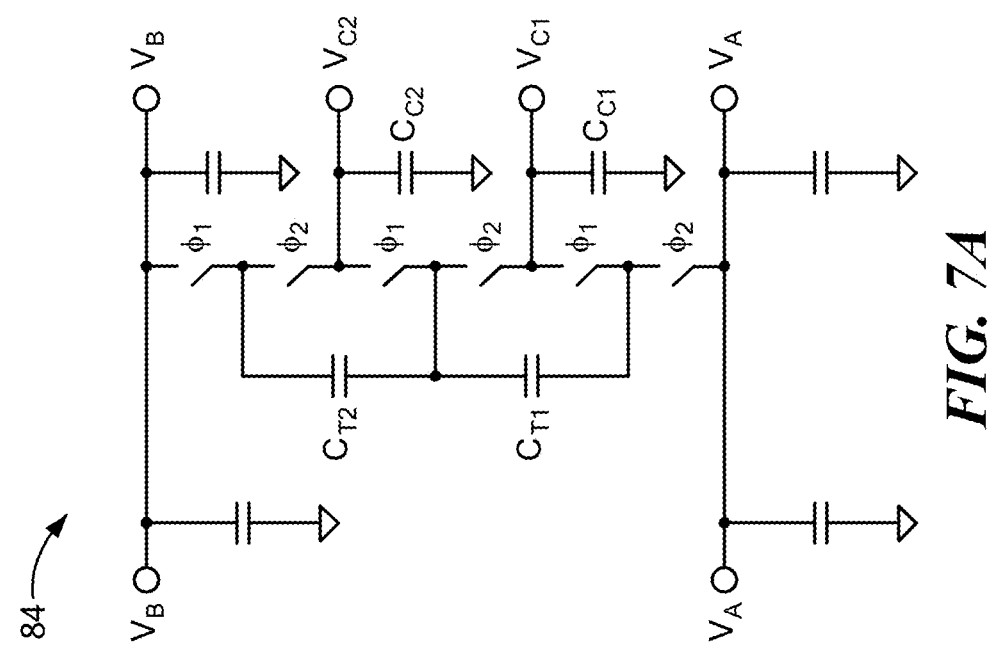
FIG. 7A is a schematic diagram of a differential capacitive energy transfer stage having a differential switched-capacitor ladder circuit structure that generates output voltages $v_{C1}$ and $v_{C2}$ that are distributed with even spacing between voltages $v_A$ and $v_B$.

For example, FIG. 7A illustrates an example DSC 84 (i.e. having a topology) that provides two output voltages $v_{C1}$ and $v_{C2}$ (for a total of 4 supply generator outputs), where $v_{C1}$ is held near $v_A+(v_B-v_A)/3$ and $v_{C2}$ is held near $v_A+(v_B-v_A) \cdot \frac{2}{3}$. This differentially-connected ladder structure can be extended to provide m−2 DSC outputs using m−2 stacked transfer capacitors $C_{T,1}, \ldots, C_{T,m-2}$ and m−1 half-bridges, as illustrated in FIG. 7B.

Figure 8:
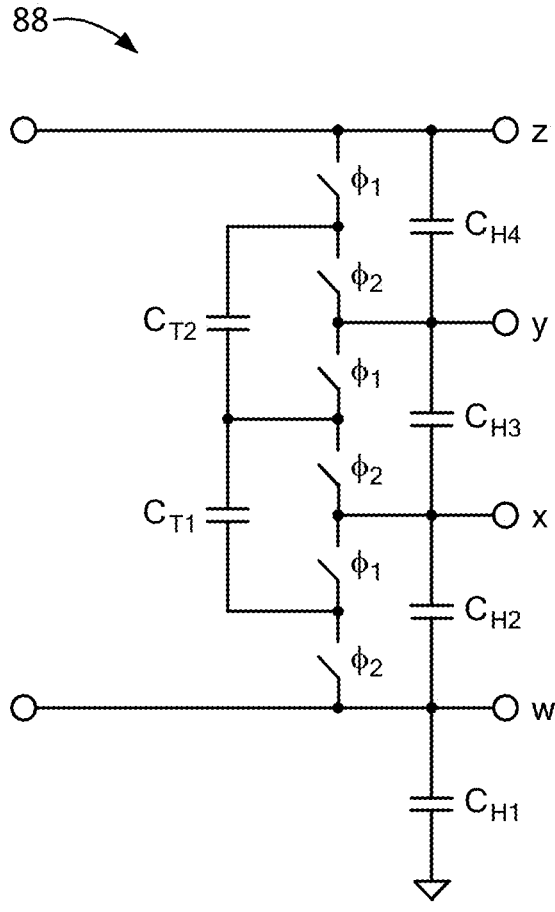
FIG. 8 is a schematic diagram of a differential capacitive energy transfer stage having four (4) nodes W, X, Y and Z that can act as either inputs or outputs.

It will be appreciated that the voltages $v_{Cj}$ need not be distributed only between $v_A$ and $V_B$. For example, FIG. 8 shows a differential capacitor energy transfer stage 90, with four (4) input/output nodes W, X, Y, and Z (i.e. nodes W, X, Y and Z can act as either inputs or outputs). For example, any two of nodes W, X, Y, and Z can be utilized as inputs ($v_A$, $v_B$) from the multi-output magnetic stage, while the remaining two nodes can be provided as outputs from the differential capacitor energy transfer stage. For example, if voltages $v_A$ and $v_B$ are provided to nodes W and Z, respectively, and nodes X and Y are taken as outputs, this circuit provides the same basic functionality as the illustrative circuit in FIG. 7A.

In this case, one difference between the circuit in FIG. 8 and the circuit of FIG. 7A is that filter/holdup capacitors $C_{H2}$ to $C_{H4}$ are provided differentially between the supply generator levels rather than to ground, which can be advantageous in their sizing and filtering capability, as they are then rated only for the voltage difference between adjacent supply voltage levels. (One can choose between differentially-connected capacitors and common-referenced capacitors for filtering/decoupling/holdup in many of the circuit designs described herein, with the preferred choice dependent upon circuit specifics.) However, it should be understood that any two of the nodes W, X, Y, and Z may be selected as input voltages to the differential capacitor energy transfer stage, and the remaining two selected as outputs of the differential capacitor energy transfer stage. By selecting appropriate ones of the nodes W, X, Y, and Z as inputs and outputs, one may then have the differential capacitor energy transfer stage develop (establish) voltages above and/or below and/or in between $v_A$ and $v_B$ while providing equal spacing between supply generator outputs (including $v_A$, $v_B$ and the differential capacitor energy transfer stage outputs). While the design of FIG. 8 provides four (4) nodes W, X, Y, Z to utilize as inputs and outputs, this basic design can provide from 3 up to any number of nodes, such as by extending the DSC structure as illustrated in FIG. 7B.

Figures 9A, 9B:
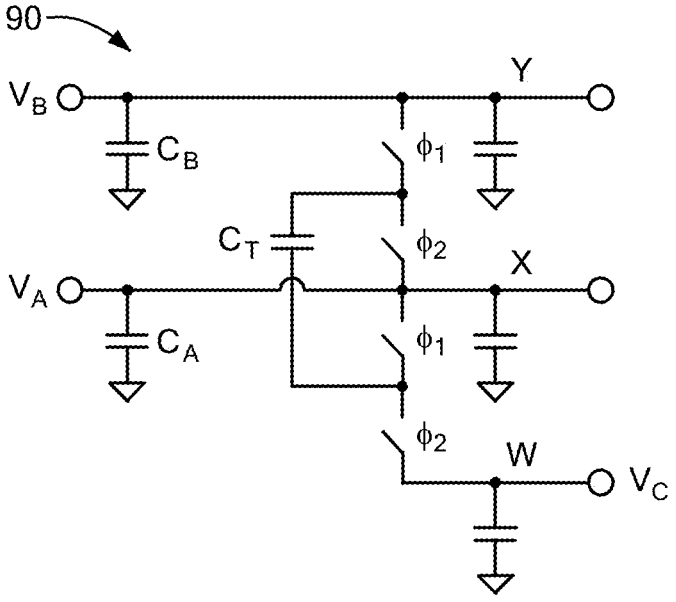
FIG. 9A is a schematic diagram of a differential capacitive energy transfer stage having three (3) nodes W, X, and Y where X and Y are used as inputs ($v_A$, $v_B$) and W is used as output $v_C$.
FIG. 9B is a schematic diagram of a circuit model representing the operational characteristics of this design, including an ideal 1:1 transformer and a resistor modeling voltage droop and loss.

As an example, a differential capacitive energy transfer stage providing a single output voltage $v_C$ below that of $v_A$ and $v_B$ is shown in FIG. 9A. This circuit is similar in some respects to the circuit of FIG. 5A, but with different nodes selected as inputs and output. Operation of the DSC circuit maintains the output voltage $v_C$ near $2 \cdot v_A - v_B$. FIG. 9B shows a circuit model for this DSC stage, where the ideal transformer captures the current transfer and ideal open-circuit voltage of the stage and $R_{droop}$ captures the loss and the droop that occurs in the output voltage from charging and discharging of the energy transfer capacitor $C_T$. The 1:1 transformer in the model maintains $v_C$ an amount below $v_A$ approximately equal to the difference $v_B - V_A$, with current drawn from $v_A$ split equally to supply $v_B$ and $v_C$. As with the design of FIG. 5A, the effective droop resistance $R_{droop}$ for this design is $1/(4 \cdot f \cdot C_T)$, where f is the switching frequency at which the DSC circuit is operated and $C_T$ is the value of the energy transfer capacitance. In the fast switching limit $R_{droop}$ becomes $R_{CT} + 2 \cdot R_{sw}$ where $R_{CT}$ is the equivalent series resistance of energy transfer capacitor $C_T$ and $2 \cdot R_{sw}$ represents the total resistance of the two switches through which current charges or discharges capacitor $C_T$.

Figure 13:
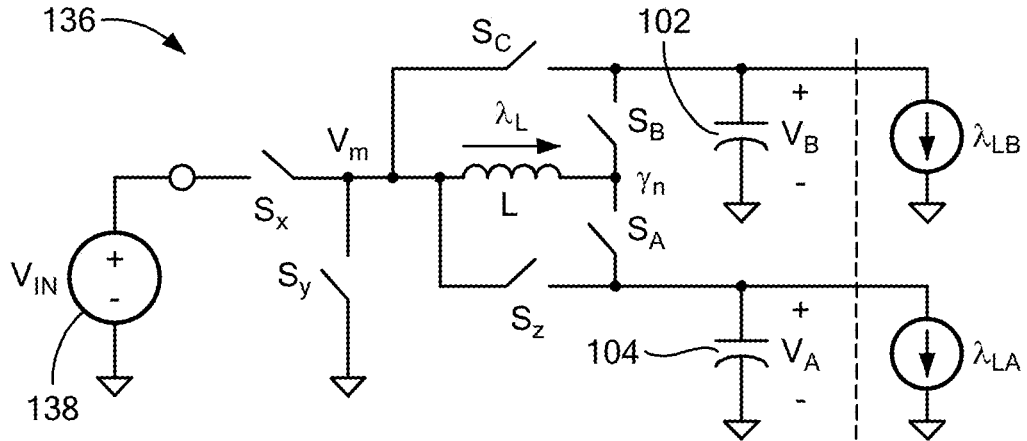
FIG. 13 is a schematic diagram of a multi-regulation power stage providing improved control across loads $i_{LA}$ and $i_{LB}$ by use of auxiliary switches $S_C$ and $S_Z$.
Figure 14:
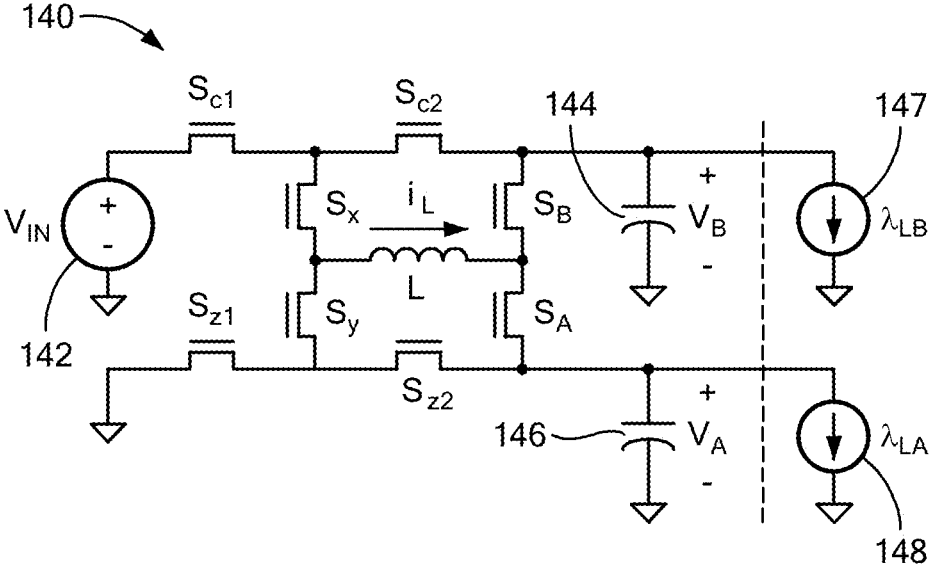
FIG. 14 is a schematic diagram of a multi-regulation power stage providing improved control across loads $i_{LA}$ and $i_{LB}$ and utilizing unidirectional blocking switches $S_{C1}$, $S_{C2}$, $S_{Z1}$ and $S_{Z2}$.
Figure 15:
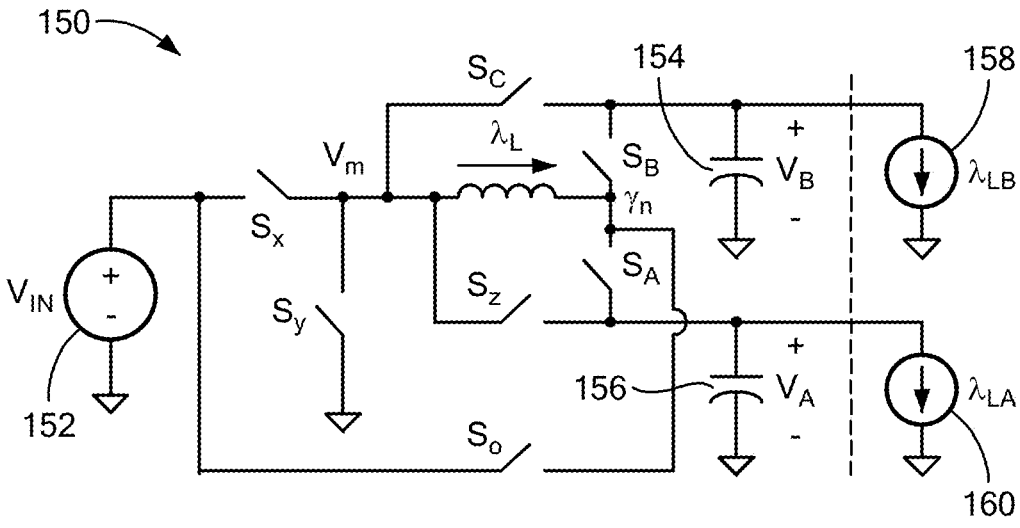
FIG. 15 is a schematic diagram of a multi-regulation power stage providing improved control across loads $i_{LA}$ and $i_{LB}$ by use of auxiliary switches $S_C$, $S_Z$ and $S_O$.

A benefit of utilizing the capacitive energy transfer stage design 90 illustrated in FIG. 9A in a supply generator is that only the current delivered to the low-voltage output $v_C$ (and a matching amount to output $v_B$) is processed through the DSC circuit 90, while the remainder is provided directly from the multi-output magnetic stage. Because the lower-voltage output $v_C$ accounts for lower peak power than the higher-voltage outputs in many power amplifier systems, this reduces the required rating of the DSC circuit and also deduces the amount of system losses due to the DSC circuit. A disadvantage of this design is inflexibility in loading or design of a supply generator system. In particular, with this design, any current delivered to $v_C$ by the DSC circuit should correspond to (and ideally, be matched by) a current delivered to $v_B$. If the load current drawn from $v_B$ ever falls below that drawn from $v_C$, then the multi-output magnetic stage should ideally be capable of processing bidirectional power flow to output $v_B$ in order to be able to regulate both $v_A$ and $v_B$. Example power stage topologies for the multi-output magnetic stage that can accomplish efficiently this are illustrated in FIGS. 13, 14, and 15.

It should be noted that one can realize differential capacitive energy transfer stages based on differentially-connected switched capacitor circuits of various types, yielding different achievable voltage distributions.

In embodiments, a differential capacitive energy transfer stage based on a DSC circuit derived from the series-parallel switched-capacitor converter may be used. In such a design, a pair of energy transfer capacitors may be maintained with voltages near a value corresponding to $(v_B - v_A)/3$, such that an output voltage $v_C$ is maintained ⅓ of the way between $v_A$ and $v_B$, or $v_C = v_A + (v_B - v_A)/3$. One could realize differential capacitive energy transfer stages based on DSC circuits derived from any type of switched-capacitor converter, including Fibonacci, Dickson, Cockroft-Walton, Hybrid Dickson/Cockroft-Walton, or other hybridizations, etc. Likewise, one could realize such a stage using partial or complete cascade of different types of switched-capacitor structures.

In some designs, one can achieve reconfigurability of voltage distributions owing to operation of the differential capacitive energy transfer stage based on operating mode changes, similar to reconfiguration techniques utilized in switched-capacitor dc-dc converters. For example, in some designs a differential capacitive energy transfer stage may have a first operating mode in which switches are operated such that a pair of energy transfer capacitors may be maintained with voltages near $(v_B - v_A)/3$, such that an output $v_C$ is maintained ⅓ of the way between $v_A$ and $v_B$, or $v_C = v_A + (v_B - v_A)/3$. In a second operating mode, switches may be are operated such that the energy transfer capacitors CT1 and CT2 are maintained with voltages near $(v_B - v_A)/2$ such that output $v_C$ is maintained ½ of the way between $v_A$ and $v_B$, or $v_C = v_A + (v_B - v_A)/2 = (v_B + v_A)/2$. The benefit of such a reconfigurable design is that it provides flexibility to achieve higher performance across varying operating conditions, at the expense of higher complexity and more switches and/or capacitors and/or interconnects than non-reconfigurable designs.

It is also possible to realize differential capacitive energy transfer stages that incorporate small amounts of magnetics that augment the capacitive energy transfer. This can be done to improve efficiency and/or provide an additional degree of control over the voltage distribution, as is sometimes accomplished in resonant switched-capacitor converters and hybrid magnetic/switched-capacitor converters.

For example, in embodiments, a differential capacitive energy transfer stage may utilize an additional small inductor L. This inductor may be realized as a physical inductor and/or by utilizing circuit parasitics such as capacitor parasitic inductance and printed circuit board trace(s). Operating such a circuit with first and second switch sets switched in a complementary fashion with 50% duty ratio at an appropriate (low) frequency (e.g., associated with resonant switched-capacitor energy conversion) allows a low output resistance while only incurring low switching loss. In principle, one can achieve the low output resistance associated with the fast switching limit, while operating at a low switching frequency.

Figure 10:
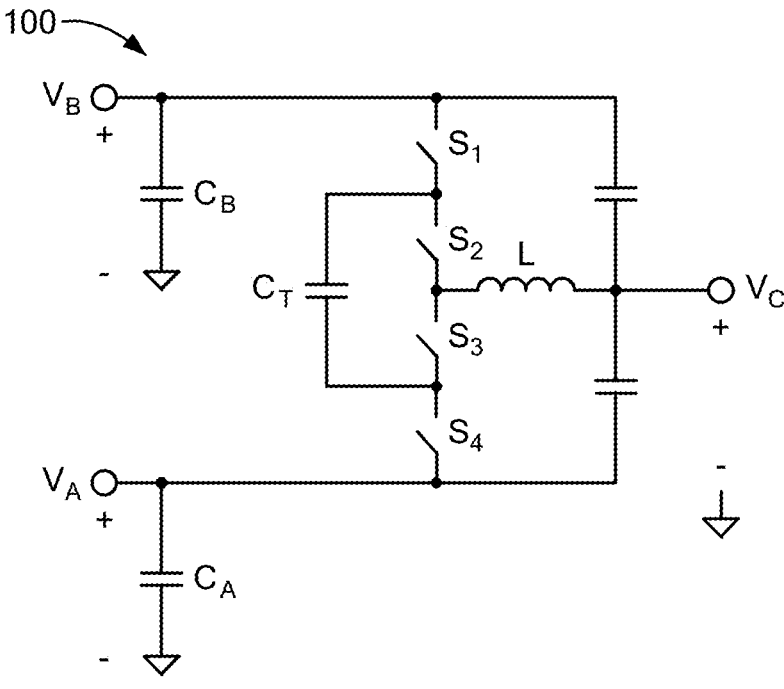
FIG. 10 is a schematic diagram of a differential capacitive energy transfer stage that can provide additional voltage regulation of output voltage $v_C$.

For example, considering the differential capacitive energy transfer stage design 100 of FIG. 10, which utilizes a circuit structure in accordance with the configuration described above, energy transfer can be managed in this design by modulating (e.g. by modulating with controlled duty cycles) among four possible switch states: $S_1$, $S_3$ on; $S_2$, $S_4$ on; $S_1$, $S_2$ on; and $S_3$, $S_4$ on. This provides flexibility to both manage the voltage/charge on energy transfer capacitor $C_T$ and control the output voltage $v_C$ to any value between $v_A$ and $v_B$ while preserving small size and required energy storage of inductor L. To do so, one can cycle among two, three or four of these switch states with controlled duty ratios, preferably with two of the switch states being $S_1$, $S_3$ on and $S_2$, $S_4$ on.

As described above at least in conjunction with FIGS. 3 and 4, a variety of different multiple-output power stage designs (multi-regulation stages) may be realized for use with the proposed architecture of FIG. 2. Next described are multi-regulation stage designs and associated controls that have particular advantages in multi-output supply generators for rf amplifiers, including but not limited to rf power amplifiers), including designs with differential capacitive energy transfer. These may likewise be employed in other single-input, multiple output power converter designs.

One challenge that may occur in some multi-regulation stages in rf amplifier system applications is that a load current drawn from on one or the other of the two outputs ($V_A$, $V_B$ in FIG. 2) may go to zero, while the other may be positive. For some differential switched-capacitor converter topologies, such as those described in conjunction with FIGS. 9A, 9B the load current on one of the outputs can even become negative, potentially overcharging the voltage on that output. This can be a significant challenge in some designs.

For example, consider a multi-regulation stage in which the load current on a first output is sufficiently large that an inductor current $i_L$ is continuously positive. If the load current on the first output goes to zero and the voltage at the first output goes transiently above its desired value (owing to the load reduction), there is no means by which the power stage can both supply the large load current at a second output (to maintain the output voltage at the second output near the a second output reference voltage) and reduce the voltage at the first output to its desired voltage. The same issue arises if it is desired to adjust the commanded voltages at the first and second outputs such that the second output becomes larger and the first output becomes smaller. The availability of an inductor current having only one polarity to source (or sink) currents from both outputs restricts the average currents that are fed to the two outputs to the same polarity. (Otherwise, either large inductor ripple current is required, or the inductor current direction must be changed in between supplying the two outputs, which can incur substantial loss and transient penalties.)

It would be desirable to have a multi-regulation stage that could regulate the voltage of a pair of outputs ($V_A$, $V_B$) even if the load current on at least one output goes to zero or is negative, while the load current on the other output is zero or positive. It would also be desirable to have a power stage that could simultaneously increase the voltage of a first output while decreasing the voltage on a second output, without requiring large loads on either output. Next described are power stage designs and associated controls that are suitable for meeting such requirements.

Figure 11:
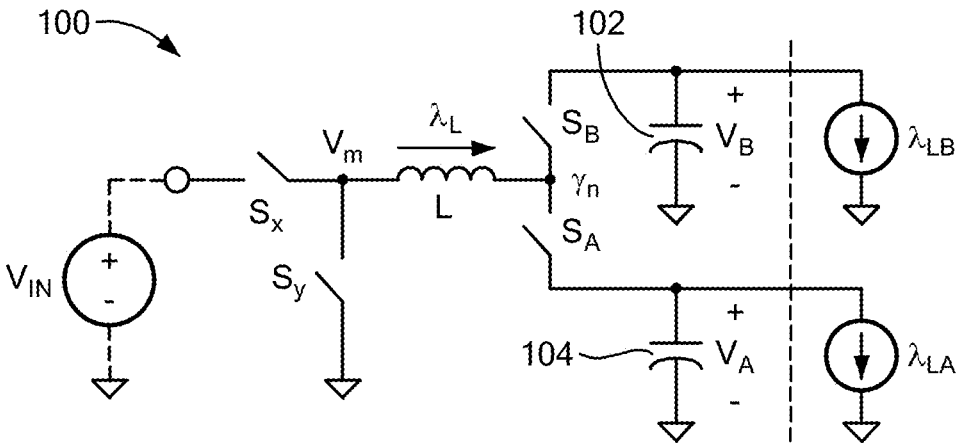
FIG. 11 is a schematic diagram of a multi-regulation stage based on a two-output buck converter.

Referring now to FIG. 11, a multi-regulation stage 110 comprises a two-output buck converter, with associated load currents $I_{LA}$, $I_{LB}$. One method for controlling this converter is to modulate (i.e. turn on and off for certain periods of time) between switches $S_B$ and $S_A$ (with $S_B$ on for duty ratio $d_o$) to control (or establish or set) the fraction of inductor current delivered to output B, and to modulate (i.e. turn on and off for certain periods of time) switches $S_X$ and $S_Y$ with ($S_X$ on for duty ratio $d_i$) to control (or establish or set) the local average of voltage $v_m$ and thereby control the weighted average of output voltages $v_A$ and $v_B$.

In one variant of this approach, one can utilize duty ratio $d_i$ as a control handle for regulating the common-mode (or average) of $v_B$ and $v_A$ with respect to the common-mode (or average) of their reference voltages $v_{B,Ref}$ and $v_{A,ref}$, and utilize duty ratio $d_o$ to regulate the difference of $v_B$ and $v_A$ with respect to the difference of reference voltages $v_{B,Ref}$ and $v_{A,ref}$. An illustrative schematic for such a controller is shown in FIG. 13.

Figure 12:
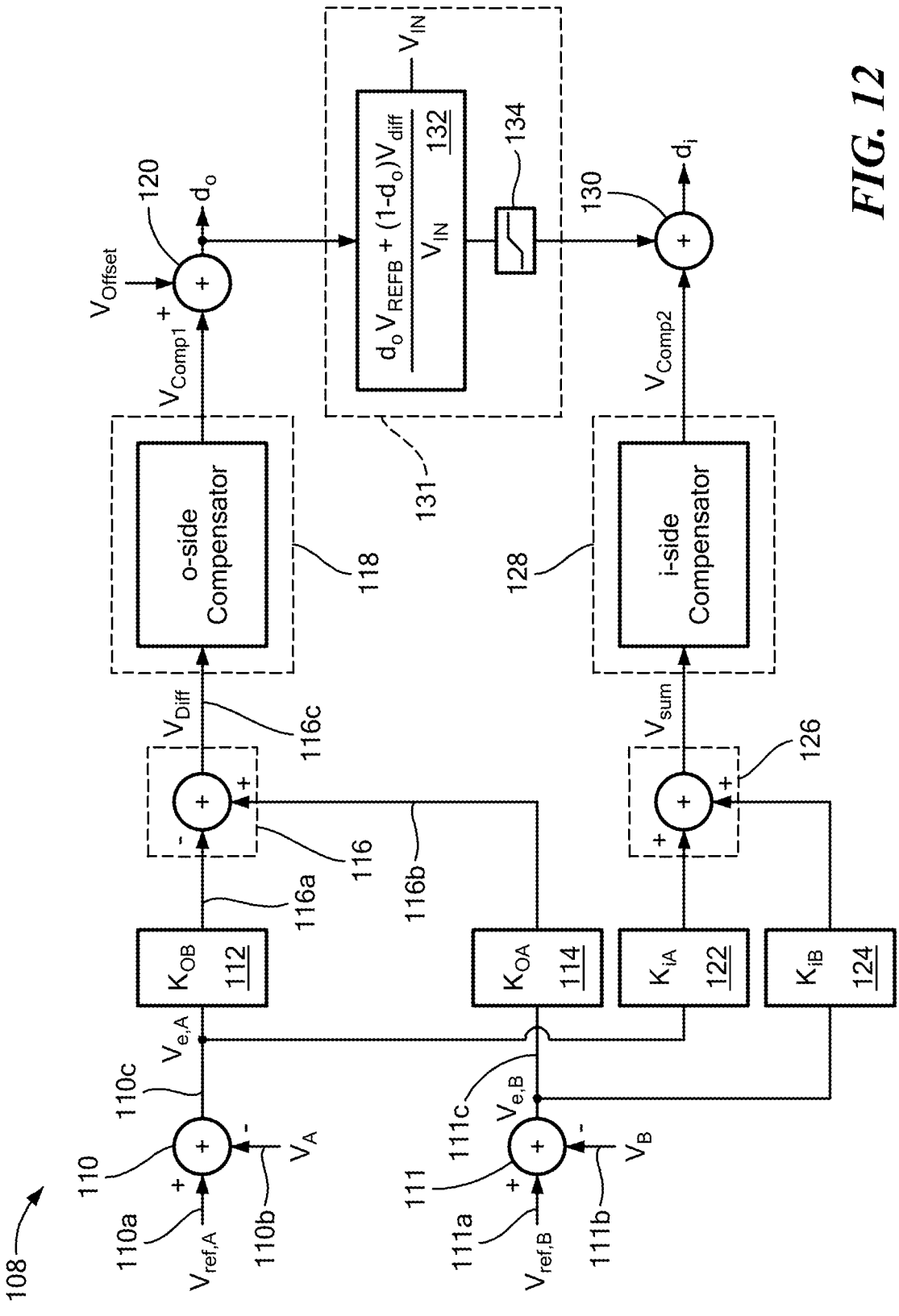
FIG. 12 is a schematic diagram of a controller for a multi-regulation stage such as that of FIG. 11.

Referring now to FIG. 12, a power stage 108 comprises first and second difference circuits 110, 111 with difference circuit 110 configured to receive a reference voltage $V_{ref,A}$ and a voltage $V_A$ at respective ones of first and second inputs 110a, 110b. Difference circuit 110 generates or otherwise forms a voltage $V_{e,A}$ corresponding to the difference between voltages $V_{ref,A}$ and $V_A$ and provides the difference (or error) voltage $V_{e,A}$ at an output 110c. Similarly, difference circuit 111 is configured to receive a reference voltage $V_{ref,B}$ and a voltage $V_B$ at respective ones of first and second inputs 111a, 111b. Difference circuit 111 generates or otherwise forms a difference (or error) voltage $V_{e,B}$ corresponding to the difference between voltages $V_{ref,B}$ and $V_B$ and provides the difference voltage $V_{e,B}$ at an output 111c.

Difference voltages $V_{e,A}$, $V_{e,B}$ are provided to respective ones of scaling circuits 112, 114. An output of scaling circuit 112 is provided to a first input 116a of a difference circuit 116 and an output of scaling circuit 114 is provided to a second input 116b of difference circuit 116. Difference circuit 116 generates or otherwise forms a voltage $V_{Diff}$ corresponding to the difference between the voltages provided thereto and provides the difference voltage $V_{Diff}$ at an output 116c. Thus, difference circuit 116 provides a differential of scaled errors (or some other function of $V_{e,A}$, $V_{e,B}$ such as selecting between $-V_{e,A}$, $V_{e,B}$ based upon which has a larger magnitude) at output 116c The scalings considered are selected to maintain the signals in a desired range. They can also control overall loop gain differently for A and B output variations. The scaling values may thus be chosen to provide desired signal scaling and desirable closed-loop dynamics. In terms of using some other function, (in place of or in addition to difference function 116), one could, for example, insert a nonlinearity function to drive the controller to compensate for a different error (which in embodiments may be considered to have a significant impact i.e. may be considered to be a more "important" error such as between 116a and 116b, for example). With respect to selecting based upon magnitude of the amplified error signal, doing so may make the controller work to compensate the larger error (or the larger scaled error) thereby reducing (and ideally minimizing) the worst (i.e. largest) deviation among the multiple output voltages.

Difference circuit output 116c is coupled to a first input 118a of a compensator circuit 118 (a so-called "output side" or "o-side" compensator). Compensator circuit 118 may be provided as a limited linear or non-linear compensator and receives signals provided at input 118a and provided a compensated output signal $V_{Comp1}$ at an output thereof 118b. This compensation signal adjusts the duty ratio to compensate (minimize) errors between the difference of output voltage Vb and Va and the desired difference (or difference in references) of output voltages Vb and Va.

Compensator output 118b is coupled to an input of an optional offset circuit 120. Offset circuit adds an offset voltage $V_{Offset}$ to the compensated voltage $V_{Comp1}$ and provide a duty cycle control value $d_o$ at an output thereof. The optional inserted offset can reduce the range of variation of the compensator and speed up transition to steady state at startup, at the expense of slight circuit complexity increase. In embodiments, the value of duty cycle control value $d_o$ may be limited to a value between 0 and 1 at the compensator or elsewhere in or after the circuit 108.

Difference voltages $V_{e,A}$, $V_{e,B}$ are also provided to respective ones of scaling circuits 122, 124. An output of scaling circuit 122 is provided to a first input 126a of a summing circuit 126 and an output of scaling circuit 124 is provided to a second input 126b of summing circuit 126. It should be noted that scaling circuits 122, 124, may scale the error voltages ages $V_{e,A}$, $V_{e,B}$ or may apply some other function to voltages $V_{e,A}$, $V_{e,B}$. For example, scaling circuits 122, 124 and summing circuit 126 may apply some other function (i.e., other than simply scaling and summing) such as selecting between the maximum value of $V_{e,A}$, $V_{e,B}$ for example selecting $\max[V_{e,A}, V_{e,B}]$, $\max[K_{iA}V_{e,A}, K_{iA}V_{e,B}]$, etc. . . . . Such an approach may indicate a worst-case output deviation to be regulated.

Summing circuit 126 generates or otherwise forms a voltage $V_{Sum}$ corresponding to the difference between the voltages provided thereto and provides the sum voltage $V_{Sum}$ at an output 126c. Thus, summing circuit 126 provides a sum value $V_{Sum}$ of the scaled errors (or some other function as noted above) at output 126c.

Output 126c of summing circuit 126 is coupled to a first input 128a of a compensator circuit 128 (a so-called "input-side" or "i-side" compensator). Compensator circuit 128 may be provided as a limited linear or non-linear compensator and receives signals provided at input 128a and provided a compensated output signal $V_{Comp2}$ at an output thereof 128b. This compensation signal adjusts the o-side duty ratio to compensate (minimize) errors between the sum of output voltages Vb and Va and the desired sum (or sum of references) of output voltages Vb and Va.

As above, the scaling values may be selected to maintain the signals in a desired range and/or control overall loop gain differently for A and B output variations. The scaling values may thus be chosen to provide desired signal scaling and desirable closed-loop dynamics. In terms of using some other function, (in place of or in addition to sum function 126), one could, for example, insert a nonlinearity function to drive the controller to compensate for a different error.

In embodiments, compensator output 128b is coupled to a first input of an optional summing circuit 130. A second input of summing circuit 130 may be configured to receive an input from an optional offset or feed forward circuit 131. This is similar to the difference circuit Voffset, but with the possible addition of feedforward based on input voltage $V_{IN}$ to help quickly compensate for input voltage variations. While some forms of input voltage feedforward are known in the art, the use of input voltage feedforward is not known or used in the context of sum and difference controls. The optional inserted offset and/or feedforward circuit 130, 131 can reduce the range of variation of the compensator and speed up transition to steady state at startup and for changes in input voltage, at the expense of slight circuit complexity increase. A duty cycle control value $d_i$ is provided at an output of optional summing circuit 130 (or at the output of compensator 128 in embodiments which do not include optional summing circuit 130). In embodiments, the value of duty cycle control value $d_i$ may be limited to a value between 0 and 1 at the compensator or elsewhere in or after the circuit 108.

In this example embodiment, circuit 131 comprises an offset circuit 132 and a limiting circuit 134. Offset circuit 131 provides feedforward values based on the input voltage and output switch duty cycle to suppress the impact of variations of the input voltage on the average of the output voltages.

In many instances, the power stage of FIG. 11 combined with the compensator of FIG. 12 will exhibit the above-described inability to quickly decrease voltage at a first output when the second output is heavily loaded, owing to having only one available polarity of current ($i_L$) to charge/discharge outputs $v_A$ and $v_B$.

The power stage and associated control circuitry and scheme as illustrated in FIGS. 11, 12 might instead or additionally regulate other functions of $v_{B,ref}$ and $v_{A,ref}$ and $v_B$ and $v_A$. For example, one might have the "input side" compensator generating $d_i$ driven by a nonlinear function such as max($k_{i,A}(v_{A,ref}-v_A)$, $k_{i,B}(v_{B,ref}-v_B)$) where max(x,y) takes the maximum of x and y and $k_{i,A}$ and $k_{i,B}$ are constants selected to help adjust loop dynamics for A and B outputs separately. Likewise, one might have the o-side compensator "output side" compensator generating $d_o$ based on a function such as max($-k_{o,A}(v_{A,ref}-v_A)$, $k_{o,B}(v_{B,ref}-v_B)$) where $k_{o,A}$ and $k_{o,B}$ are constants selected to help adjust loop dynamics for A and B outputs separately. Such compensators might themselves be linear or nonlinear, and include proportional, integral, and derivative terms, and/or utilize techniques such as anti-windup. Likewise, one may include cross coupling between $d_i$ and $d_o$ compensators, feedforward from the input, offsets, etc.

Referring now to FIG. 13 in which like elements of FIG. 11 are provided having like reference designations, an alternative power stage 136 incorporating two additional switches $S_C$ and $S_Z$ over that of the circuit topology illustrated in FIG. 11. Inclusion of one or both of switches $S_C$ and $S_Z$ and operating the switch(es) and operation of the switches in certain modes, as described below, can improve the ability of the multiple-output power stage to adjust the output voltages as desired, independent of loading conditions (i.e. switches $S_C$ and $S_Z$ can be operated in a manner which improves the ability of the multiple-output power stage to adjust the output voltages). It should be noted that one could implement a power stage with one of $S_C$ or $S_Z$ or with both $S_C$ and $S_Z$, depending upon requirements. One might often elect to have both Sc and Sz, but one may need Sc only when one needs bidirectional current (or power) transfer to output B and only need Sz only when one needs bidirectional current (or power) transfer to output A. So, inclusion of one or both switches depends upon the required load current ranges of outputs A and B, with inclusion of both providing flexibility for any relative loadings among outputs.

The additional switch(es) $S_C$ and $S_Z$ can be incorporated into converter operation by transiently operating switch(es) $S_C$ and $S_Z$ to provide additional control when a given output is over voltage and insufficiently loaded, unloaded or negatively loaded (i.e., absorbing energy from the load instead of delivering energy to the load). One possible approach is to enter one or more special operating modes under prespecified conditions of the converter output(s) and/or of the compensator and/or of the internal power stage state. One may make decisions about having a special mode active on a cycle-by-cycle basis, e.g., determining at the start of each switching cycle if a special mode is active.

An example of one such special operational mode (referred to as "special mode 1") is as follows: during special mode 1, modulate between $S_X$ and $S_Z$ instead of between $S_X$ and $S_Y$ (as is done in normal operation).

For example, one may make special mode 1 active in a cycle when $v_A > v_{A,ref}$ and $v_B < v_{B,ref}$. In this case, when output A is over its desired voltage and output B is under its desired voltage, special mode 1 utilizes the (positive) inductor current $i_L$ to charge output B from output A, speeding the transition of each of these voltages towards their desired values. This can enable reduction of the voltage $v_A$ to the reference voltage $v_{A,ref}$ even in the absence of a load on output A or in the presence of a negative load at output A. Once output A is reduced to the desired value ($v_A <= v_{A,ref}$), the special mode will automatically end, and normal operation will resume. The special mode 1 may optionally utilize the normal-mode input-side compensator to make modulation decisions during special mode 1 (e.g., the "i-side compensator" synthesizing duty ratio command $d_i$ in FIG. 12), or may utilize a separate compensator for this special mode.

It will be appreciated that additional or alternative constraints can be utilized for determining when the special mode 1 (utilizing switch $S_Z$) is active. For example, one may use any of the following alternative sets of constraints to determine when special mode 1 is active (e.g., making special mode decisions at the start of each cycle):

Special mode 1 active when $v_A > v_{A,ref}$ and $d_O$ compensator output >=1 (i.e., output A is over voltage and the switch $S_B$ is being held on continuously by the output side compensator. This ensures that there will be no duration in which the inductor current $i_L$ only circulates among switches.)

Special mode 1 active when $v_A > v_{A,ref}$ and $v_B < v_{B,ref}$ and $d_O$ compensator output >=1 (i.e., constrain special mode 1 for both under voltage on output A, over-voltage on output B, and output side compensator holding switch B on continuously.)

Special mode 1 active when $v_A > v_{A,ref}$ and $v_B < v_{B,ref}$ and $i_L > 0$ (i.e., constrain special mode 1 for both over-voltage on output A, under-voltage on output B, and inductor current $i_L > 0$. The evaluation of inductor current $i_L$ could be for a specific time point, such as at the start of the present cycle or at a time point in the previous cycle. One could also use some current equivalent to $i_L$ for decision purposes or utilize some local average current as a constraint. This helps ensure that charging between $v_A$, $v_B$ is in the appropriate direction.)

The above described special mode 1 utilizes additional switch $S_Z$ to aid with transient situations when $v_A$ is over voltage. We can utilize additional switch $S_C$ in a special mode to aid with transient situations when $v_B$ is over voltage. One way to do this is with a special mode 2 as follows:

Special mode 2: During special mode 2, modulate between $S_C$ and $S_Y$ instead of between $S_X$ and $S_Y$ as in normal operation.

For example, one may make special mode 2 active in a cycle when $v_B > v_{B,ref}$ and $V_A < v_{A,ref}$. In this case, when output B is over its desired voltage and output A is under its desired voltage, special mode 2 utilizes the (positive) inductor current $i_L$ to charge output A from output B. This can enable reduction of the voltage $v_B$ to the reference voltage $v_{B,ref}$ even in the absence of a load on output B or in the presence of a negative load at output B. Once output B is reduced to the desired value ($v_B <= v_{B,ref}$), the special mode will automatically end, and normal operation will resume. The special mode 2 may optionally utilize the normal-mode input-side compensator to make modulation decisions during special mode 2 (e.g., the "i-side compensator" synthesizing duty ratio command $d_i$ in FIG. 12), or may utilize a separate compensator for this special mode.

It will be appreciated that additional or alternative constraints can be utilized for determining when the special mode 2 (utilizing switch $S_C$) is active. For example, one may use any of the following alternative sets of constraints to determine when special mode 2 is active (e.g., making special mode decisions at the start of each cycle):

Special mode 2 active when $v_B > v_{B,ref}$ and $d_O$ compensator output $<= 0$ (i.e., output B is over voltage and the switch $S_A$ is being held on continuously by the output side compensator. This ensures that there will be no duration in which the inductor current $i_L$ only circulates among switches.)

Special mode 2 active when $v_B > v_{B,ref}$ and $v_A < v_{A,ref}$ and $d_O$ compensator output $<= 0$ (i.e., constrain special mode 2 for both under-voltage on output A, over-voltage on output B, and output side compensator holding switch A on continuously.)

Special mode 2 active when $v_B > v_{B,ref}$ and $v_A < v_{A,ref}$ and $i_L > 0$ (i.e., constrain special mode 2 for both over-voltage on output B, under-voltage on output A, and inductor current $i_L > 0$. The evaluation of inductor current $i_L$ could be for a specific time point, such as at the start of the present cycle or at a time point in the previous cycle. One could also use some current equivalent to $i_L$ for decision purposes or utilize some local average current as a constraint. This helps ensure that charging is in the appropriate direction.)

The above special modes utilize auxiliary switches $S_C$ and $S_Z$ to provide improved control and transient performance when there are load changes on outputs A, B and/or when there are changes to the reference voltages reference voltages $v_{B,ref}$ and $v_{A,ref}$ that would be difficult to quickly address with the power stage of FIG. 11. As auxiliary switches $S_C$ and $S_Z$ only need to operate transiently, it will be appreciated that they can be sized significantly smaller (i.e., with higher on-state resistances and/or smaller semiconductor device area) than the main power stage switches. For example, $S_Z$ may be sized small with respect to $S_Y$, and $S_C$ sized small compared to $S_X$ without substantial degradation of system efficiency. For example, these auxiliary switches might be rated to have between 4 times to 20 times the on-state resistances of their corresponding main power stage switches. This modest sizing of the auxiliary switches helps reduce (and ideally, minimize) the impact on overall converter size and/or semiconductor die area of a power management integrated circuit for implementing this power stage. Switches $S_C$ and $S_Z$ in FIG. 13 necessarily must be implemented as bidirectional blocking switches. They may thus be realized as back-to-back connections of MOSFET devices or using integrated lateral MOSFET devices (such as in a silicon CMOS process) in which the potential of their back-gates are adjusted depending upon the required blocking direction at a given point in time (i.e., "back-gate" or "body" switching).

It should be appreciated that while the power stage 136 of FIG. 13 is shown with capacitors from each of outputs A, B to common, a practical design might additionally or instead of one of these capacitors include a capacitor between outputs A, B. Likewise, there may be loads connected differentially between outputs A,B. Moreover, the loads on the outputs A,B could include a differential switched-capacitor stage to provide additional outputs spaced between or around the voltages at outputs A,B.

It should be appreciated that the proposed special modes can likewise be realized with other topological configurations, some of which do not require bidirectional blocking switches for the auxiliary switches as illustrated, for example, in the circuit topology of FIG. 14

Referring now to FIG. 14, an input voltage from source 142 is coupled to a first terminal of a first switch $S_{C1}$ and a second terminal of switch $S_{C1}$ is coupled to a first terminal of a second switch $S_{C2}$. The second terminal of switch $S_{C2}$ is coupled to an output having an associated load current $I_{LA}$, 147. A pair of switches Sx, Sy are coupled between the second terminal of first switch $S_{C1}$ and a reference potential. Switch $S_{Z1}$ has a first terminal coupled to a reference potential (here, illustrated as ground) and a second terminal coupled to a terminal of switch Sy. Switch $S_{Z2}$ has a first terminal coupled to the second terminal of switch Sy and a second terminal coupled to an output having an associated load current $I_{LB}$. 148. A pair of switches $S_A$, $S_B$ are coupled between the second terminal of switch $S_{C2}$ and the second terminal of switch $S_{Z2}$. An inductor L is coupled between the second terminal of switch $S_X$ and he second terminal of switch $S_B$.

In the implementation of FIG. 14, switches $S_{C1}$, $S_{C2}$, $S_{Z1}$ and $S_{Z2}$ may each be made unidirectional blocking. As with the design of FIG. 11, input side modulation may be conducted with switches $S_X$ and $S_Y$ via a duty ratio $d_i$ (e.g., as per FIG. 12), and output side modulation may be conducted with devices $S_B$ and $S_A$ via a duty ratio $d_o$ (e.g., as per FIG. 12.) In normal mode operation, switches $S_{C1}$ and $S_{Z1}$ are held "on" (i.e. the switches are biased into a conducting state such that a low impedance signal path exists between first and second switch terminals). In special mode 1 operation, switches $S_{C1}$ and $S_{Z2}$ are held on, and in special mode 2 operation switches $S_{C2}$ and $S_{Z1}$ are held on. For this topology, then, it may be desirable to size switches $S_{C1}$ and $S_{Z1}$ to be similar size or large compared to $S_X$, $S_Y$ (i.e., have similar or much lower resistances, e.g., resistances of $S_{C1}$ and $S_{Z1}$ scaled by a factor of 0.1-1 compared to $S_X$, $S_Y$), while switches $S_{C2}$ and $S_{Z2}$ may be made smaller (i.e. have much larger resistances, e.g., scaled by a factor of 4-20) than switches $S_X$, $S_Y$.

As described above, the special operating modes may optionally utilize the input-side $d_i$ compensator to control switch modulation during the special mode operation. In doing this it may be desirable to place an offset in the compensator output ($d_i$ duty ratio command) during special mode operation. This might be done, for example, such that the local average value $v_m$ in FIG. 13 is not disturbed by the operating mode change during the transient (i.e., that the relationship between the compensator output and the local average voltage commanded at $v_m$ remains unchanged.) For each special mode, the compensator offset may be selected as a predetermined function of one or more of: $V_{in}$, $v_A$, $v_B$, $d_i$, $v_{A,ref}$, $v_{B,ref}$.

Alternatively, one may simply use the input side compensator to generate a duty ratio $d_i$ based on the average error in output voltages $v_A$ and $v_B$ (or some other function of $v_A$, $v_B$, $v_{A,REF}$ and $v_{B,REF}$), without regard to whether one is operating in normal mode (modulating between $S_X$ and $S_Y$ with $S_X$ on with duty ratio $d_i$), special mode 1 (modulating between $S_X$ and $S_Z$ with $S_X$ on with duty ratio $d_i$) or special mode 2 (modulating between $S_C$ and $S_Y$ with $S_C$ on with duty ratio $d_i$).

The above designs introduce special operating modes based on the input-side switching modulation. It is also possible to have designs that—instead or additionally—adjust the output side switching for special mode operation. The above described designs introduced auxiliary switches and operational modes in which energy may be transiently transferred between outputs A and B to more rapidly adjust to load changes and/or reference voltage changes. It is also possible to introduce special operating modes in which energy is transferred from both outputs A and B to the input to more rapidly adjust for changes in operating conditions.

FIG. 15, for example, illustrates a further power stage circuit 150 comprising an auxiliary switch $S_O$. One may have a special operating mode 3, which may be active when $v_B > v_{B,ref}$ and $v_A > v_{A,ref}$ (i.e., active when both output voltages are over-voltage). In this special mode 3, one may hold $S_X$, $S_Y$, $S_A$, $S_B$ off, hold $S_O$ on, and modulate between $S_Z$ and $S_C$ with a duty ratio depending upon the relative need to discharge $v_A$ and $v_B$. This enables a (positive) inductor current $i_L$ to be utilized to rapidly (i.e., only as limited by the available amplitude of current $i_L$) discharge $v_A$ and $v_B$ by transferring energy to the input without the need to reverse the inductor current direction first. As special mode 3 may be used as a transient operating mode, one may again optionally size switch $S_O$ to be small (e.g., by a factor of 4-20) relative to switches $S_X$ and $S_Y$. One may likewise conceive special operating modes that leverage auxiliary switches SC, SZ and SO to enable rapid energy transfers among any of the three ports $V_{IN}$, $V_A$, $V_B$ without needing to change the direction of inductor current $i_L$.

Illustrative examples of supply generators comprising a power conversion stage with multiple independently-regulated outputs and a power converter stage are described herein and illustrated in the drawings. Those of ordinary skill in the art will appreciate that the circuit implementations described herein are provided merely as examples and that no particular circuit implementation is implied as being necessary or desirable unless otherwise noted.

Having thus described several aspects of at least one embodiment which illustrate the described concepts, it is to be appreciated that various alterations, modifications, and improvements will readily occur to those skilled in the art. Such alterations, modifications, and improvements are intended to be part of this disclosure and are intended to be within the spirit and scope of the concepts described herein. Further, though advantages of the concepts described herein are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the concepts described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the concepts described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "close," "near," "approximately" and "about" may be used to mean within ±20% of a target value in some embodiments, within ±10% of a target value in some embodiments, within ±5% of a target value in some embodiments, and yet within ±2% of a target value in some embodiments. The terms "close," "near," "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The phrase "slow switching limit" (as is known in the analysis of SC converters and as used above in conjunction with FIG. 5A, for example) refers to the relation of the value of Rout in that limit to switching frequency and capacitor size.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

For purposes of the description above, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary layers or structures at the interface of the two elements.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

All publications and references cited herein are expressly incorporated herein by reference in their entirety.

The invention claimed is:

1. A system to generate multiple power supply voltages using parallel power converters, the system comprising:
   a multi-regulation stage having two or more dc-dc converters each configured to receive an input voltage and to regulate at least one independently-regulated supply voltage at one or more outputs thereof; and
   a differential capacitive energy transfer stage configured to synthesize one or more additional supply voltages in a prescribed relation to the independently-regulated supply voltages, at one or more outputs thereof.

2. The system of claim 1 wherein each dc-dc converter has one input and one output.

3. The system of claim 1 wherein at least one of the two or more dc-dc converters is a buck converter.

4. The system of claim 1 wherein the differential capacitive energy transfer stage provides charge transfer from the two or more outputs of the multi-regulation stage so as to distribute the one or more additional supply voltages.

5. The system of claim 4 wherein the one or more additional supply voltages are distributed evenly between two of the independently-regulated supply voltages.

6. The system of claim 4 wherein the one or more additional supply voltages are distributed evenly around two of the independently-regulated supply voltages.

7. The system of claim 1 wherein the one or more additional supply voltages include at least two additional supply voltages.

8. The system of claim 1 wherein at least one of the two or more dc-dc converters comprises a single-inductor multiple-output (SIMO) power converter.

9. The system of claim 1 wherein the differential capacitive energy transfer stage comprises a switched-capacitor converter having an input port connected differentially between two of the two or more outputs of the multi-regulation stage.

10. The system of claim 9 wherein the differential capacitive energy transfer stage comprises a single-output switched-capacitor converter.

11. The system of claim 9 wherein the differential capacitive energy transfer stage comprises a multiple-output switched-capacitor converter.

12. The system of claim 1 wherein the differential capacitive energy transfer stage includes a circuit having a plurality of switches connected in series between two of the two or more outputs of the multi-regulation stage and further includes a capacitor connected in parallel with one or more of the plurality of switches.

13. The system of claim 12 wherein the plurality of switches are operated to provide charge transfer from the two or more outputs of the multi-regulation stage so as to distribute the one or more additional supply voltages.

14. The system of claim 12 wherein the differential capacitive energy transfer stage has an interleaved structure comprising two of said circuit connected in parallel.

15. The system of claim 12 wherein the differential capacitive energy transfer stage has a ladder structure comprising two of said circuit connected in series.

16. The system of claim 1 wherein the differential capacitive energy transfer stage comprises at least three outputs, wherein two outputs of the at least three outputs are directly connected to the two or more outputs of the multi-regulation stage.

17. The system of claim 1 wherein the differential capacitive energy transfer stage comprises at least four outputs, wherein two outputs of the at least four outputs are directly connected to the two or more outputs of the multi-regulation stage, and wherein the other outputs of the at least four outputs correspond to the one or more outputs of the differential capacitive energy transfer stage at which the additional supply voltages are provided.

18. The system of claim 17 wherein the differential capacitive energy transfer stage comprises a plurality of filter/holdup capacitors connected between different pairs of the at least four outputs.

19. The system of claim 18 wherein each of the plurality of filter/holdup capacitors are rated for a difference between power supply voltages provided at the respective pair of outputs.

20. The system of claim 1 wherein at least one of the two or more dc-dc converters comprises a two-output buck converter.

21. The system of claim 1 wherein the multi-regulation stage comprises a circuit having an inductor and a plurality of switches connected between the inductor and different ones of the two or more outputs.

22. The system of claim 21 further comprising a controller to operate the plurality of switches of the multi-regulation stage.

23. The system of claim 1 wherein the multi-regulation stage is configured to regulate the independently-regulated supply voltages if load current on one of the two or more outputs goes to zero or is negative while load current on another of the two or more outputs is zero or positive.

24. A multiple-output supply generator comprising:

(1) a multi-regulation stage having two or more dc-dc converters each configured to receive an input voltage and to regulate at least one independently-regulated supply voltage at one or more outputs thereof; and (2) a differential capacitive energy transfer stage which utilizes capacitive energy transfer from the independently-regulated outputs of the multi-regulation stage to synthesize one or more additional outputs whose voltages and/or currents are a function of those provided from the multi-regulation stage outputs.

25. The multiple-output supply generator of claim 24 wherein:

at least one of the two or more dc-dc converters is provided as a single-inductor multiple-output (SIMO) power converter; and the differential capacitive energy transfer stage is provided as a single- or multiple-output switched-capacitor converter having its input port connected differentially between two outputs of the multi-regulation stage.

26. The multiple-output supply generator of claim 24 wherein:

at least one of the two or more dc-dc converters is provided as an independently-regulated dc-dc converter having one input and one output; and the differential capacitive energy transfer stage is provided as a single- or multiple-output switched-capacitor converter having its input port connected differentially between two outputs of the multi-regulation stage.

27. The multiple output supply generator of claim 24 wherein at least one of the two or more dc-dc converters is provided as a buck converter.

\* \* \* \* \*